(12) United States Patent
Tsukuda et al.

(10) Patent No.: US 9,407,846 B2
(45) Date of Patent: Aug. 2, 2016

(54) ANALOG-TO-DIGITAL CONVERSION DEVICE

(71) Applicant: Sony Corporation, Tokyo (JP)

(72) Inventors: Yasunori Tsukuda, Kanagawa (JP); Takashi Moue, Kanagawa (JP); Yosuke Ueno, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/541,712

(22) Filed: Nov. 14, 2014

(65) Prior Publication Data

US 2015/0171884 A1    Jun. 18, 2015

(30) Foreign Application Priority Data

Dec. 16, 2013  (JP) ................................. 2013-258787

(51) Int. Cl.
| | | |
|---|---|---|
| *H04N 5/378* | (2011.01) | |
| *H04N 5/374* | (2011.01) | |
| *H03M 1/08* | (2006.01) | |
| *H04N 5/369* | (2011.01) | |
| *H03M 1/12* | (2006.01) | |
| *H03M 1/56* | (2006.01) | |

(52) U.S. Cl.
CPC ............. *H04N 5/374* (2013.01); *H03M 1/0863* (2013.01); *H04N 5/3698* (2013.01); *H04N 5/378* (2013.01); *H03M 1/123* (2013.01); *H03M 1/56* (2013.01)

(58) Field of Classification Search
None
See application file for complete search history.

(56) References Cited

FOREIGN PATENT DOCUMENTS

JP    2012-151613    8/2012

*Primary Examiner* — Roberto Velez
*Assistant Examiner* — Yih-Sien Kao
(74) *Attorney, Agent, or Firm* — Michael Best and Friedrich LLP

(57) ABSTRACT

An analog-to-digital conversion device includes a plurality of counting period supply units that supply a period of length according to a voltage of an analog signal inputted into each counting period supply unit based on the voltage of the analog signal as a counting period, a plurality of counter circuits which are connected to a common power supply and which perform a counting operation that counts a count value in the counting period different from each other and generate a digital signal indicating the count value, and a plurality of compensation circuits which are connected to the power supply and which operate so that the greater the number of counter circuits that stop the counting operation among the plurality of counter circuits, the greater the number of the compensation circuits that operate.

10 Claims, 21 Drawing Sheets

*FIG. 5*

| | OPERATION OF FLIP-FLOP | | |
|---|---|---|---|
| D | CK | CLR | Q |
| 0 | ↑ | 0 | 0 |
| 1 | ↑ | 0 | 1 |
| 1/0 | ↓ | 0 | HOLD DATA OF PREVIOUS STATE |
| 1/0 | ↑/↓ | 1 | 0 |

FIG. 6

| D | CK | CLR | Q |
|---|---|---|---|
| \multicolumn{4}{c}{OPERATION OF UPPER LATCH} | | | |
| 0 | 1 | 0 | 0 |
| 1 | 1 | 0 | 1 |
| 0/1 | 0 | 0 | HOLD DATA OF PREVIOUS STATE |
| 0/1 | 0/1 | 1 | 0 |

FIG. 15

| OPERATION TABLE OF BIT DATA HOLDING CIRCUIT | | | | |
|---|---|---|---|---|
| ENABLE $EN_k$ | CKref | RSs | BIT DATA $Q_k$ | ENABLE $EN'_k$ |
| 0/1 | 0 | 0 | HOLD PREVIOUS DATA | 0 |
| 0 | 1 | 0 | HOLD PREVIOUS DATA | 0 |
| 1 | 1 | 0 | UPDATE TO "1" | 1 |
| 0/1 | 0 | 1 | UPDATE TO "0" | 0 |
| 0 | 1 | 1 | UPDATE TO "0" | 0 |
| 1 | 1 | 1 | UPDATE TO "0" | 1 |

*FIG. 16*

| OPERATION TABLE OF ENABLE GENERATION CIRCUIT |||
|---|---|---|
| BIT DATA $Q_{k-1}$, $Q_k$ | ENABLE SIGNALS $EN'_{k-1}$, $EN'_k$ | ENABLE $EN_k$ |
| VALUES ARE THE SAME | BOTH SIGNALS ARE 1 | HOLD PREVIOUS $EN_1$ |
| VALUES ARE THE SAME | AT LEAST ONE SIGNAL IS 0 | 0 |
| VALUES ARE NOT THE SAME | | 1 |

FIG. 18A

OPERATION OF DIGITAL DATA GENERATION UNIT OF FIRST EMBODIMENT

| CKref | UPPER LATCH OF 1ST BIT | LOWER LATCH OF 1ST BIT | UPPER LATCH OF 2ND BIT | LOWER LATCH OF 2ND BIT | UPPER LATCH OF 3RD BIT | LOWER LATCH OF 3RD BIT | CNTs |
|---|---|---|---|---|---|---|---|
| 0 (1ST TIME) | 0→1 | HOLD 0 | 0→0 | HOLD 0 | 0→0 | HOLD 0 | 000... |
| 1 (1ST TIME) | HOLD 1 | 0→1 | HOLD 0 | 0→0 | 0→0 | 0→0 | 100... |
| 0 (2ND TIME) | 1→1 | HOLD 1 | 0→1 | HOLD 0 | HOLD 0 | 0→0 | 100... |
| 1 (2ND TIME) | HOLD 1 | 1→1 | HOLD 1 | 0→1 | 0→1 | HOLD 0 | 110... |
| 0 (3RD TIME) | 1→1 | HOLD 1 | 1→1 | HOLD 1 | HOLD 0 | 0→1 | 110... |
| 1 (3RD TIME) | HOLD 1 | 1→1 | HOLD 1 | 1→1 | HOLD 1 | 0→1 | 111... |

FIG. 18B

| | OPERATION OF DIGITAL DATA GENERATION UNIT OF SECOND EMBODIMENT | | | | | |
|---|---|---|---|---|---|---|
| CKref | BIT DATA HOLDING CIRCUIT (1ST STAGE) | ENABLE GENERATION CIRCUIT (1ST CIRCUIT) | BIT DATA HOLDING CIRCUIT (2ND STAGE) | ENABLE GENERATION CIRCUIT (2ND CIRCUIT) | BIT DATA HOLDING CIRCUIT (3RD STAGE) | CNTs |
| 0 (1ST TIME) | HOLD 0 | HOLD 0 | HOLD 0 | HOLD 0 | HOLD 0 | 000... |
| 1 (1ST TIME) | 0→1 | HOLD 0 | HOLD 0 | HOLD 0 | HOLD 0 | 100... |
| 0 (2ND TIME) | HOLD 1 | 0→1 | HOLD 0 | HOLD 0 | HOLD 0 | 100... |
| 1 (2ND TIME) | HOLD 1 | HOLD 1 | 0→1 | HOLD 0 | HOLD 0 | 110... |
| 0 (3RD TIME) | HOLD 1 | 1→0 | HOLD 1 | 0→1 | HOLD 0 | 110... |
| 1 (3RD TIME) | HOLD 1 | HOLD 0 | HOLD 1 | HOLD 1 | 0→1 | 111... |

ANALOG-TO-DIGITAL CONVERSION DEVICE

CROSS REFERENCE TO RELATED APPLICATIONS

This application claims the benefit of Japanese Priority Patent Application JP 2013-258787 filed on Dec. 16, 2013, the entire contents of which are incorporated herein by reference.

TECHNICAL FIELD

The present disclosure relates to an analog-to-digital conversion device. More specifically, the disclosure relates to an analog-to-digital conversion device that converts a plurality of analog signals into digital signals.

BACKGROUND ART

In the past, in various electronic devices, a column AD (Analog to Digital) converter that converts each of a plurality of analog signals into a digital signal is used. An image pickup device in which the column AD converter is provided in an image pickup element is proposed (for example, see PTL 1). In the image pickup device, the column AD converter includes a plurality of column cells, each of which AD-converts an analog signal from one pixel. Each of the column cells includes a comparator that compares voltages of an analog signal and a ramp signal and a counter that performs counting when the comparison result is high level. By this configuration, the comparator outputs a high level comparison result over a period according to the voltage of the analog signal and the counter performs counting over the period. As a result, the analog signal is converted into a digital signal that indicates a count value according to the voltage of the analog signal.

CITATION LIST

Patent Literature

[PTL 1]
JP 2012-151613 A

SUMMARY

Technical Problem

However, in the column AD converter described above, while a plurality of counters are operating, if some of the counters stop, there may be a risk that the analog-to-digital conversion is not performed correctly. As described above, each counter in the column AD converter stops when the comparison result becomes low level, and current consumption of the column AD converter decreases accordingly. This is because although a through-current flows through an inverter in the counter every time the count value is updated while the counter is operating, the through-current does not flow when the counter stops. When the current consumption of the column AD converter decreases, a transient voltage drop LdI/dt occurs in the column AD converter due to an inductance component of a power supply line that supplies power to the column AD converter.

Here, L is a value of the inductance component and dI/dt is the time rate of change of the current. The greater the number of counters that stop at the same time, the greater the time rate of change of the current dI/dt. Further, the higher the resolution of the AD conversion, the greater the circuit scale of each counter and the greater the current consumption during operation, so that the time rate of change dI/dt increases when the counter stops. When the time rate of change dI/dt is large, a voltage drop LdI/dt is large, so that there may be a risk that a malfunction occurs in a counter that is performing counting and a correct count value is not obtained. Therefore, in the column AD converter, while a plurality of counters are operating, if some of the counters stop, there may be a risk that the AD conversion is not performed correctly.

The present technique is made in view of the above situation, and it is desirable for the AD conversion device to perform analog-to-digital conversion correctly even when some of the counters stop while a plurality of counters are operating in the AD conversion device.

Solution to Problem

The present technique is made in view of the above problem, and according to a first aspect of the present technique, there is provided an analog-to-digital conversion device including a plurality of counting period supply units that supply a period of length according to a voltage of an analog signal inputted into each counting period supply unit based on the voltage of the analog signal as a counting period, a plurality of counter circuits which are connected to a common power supply and which perform a counting operation that counts a count value in the counting period different from each other and generate a digital signal indicating the count value, and a plurality of compensation circuits which are connected to the power supply and which operate so that the greater the number of counter circuits that stop the counting operation among the plurality of counter circuits, the greater the number of the compensation circuits that operate. This causes an effect that the greater the number of the counter circuits that stop, the greater the number of the compensation circuits that operate.

In the first aspect, each of the plurality of counter circuits includes multi-stage first flip-flops connected to the power supply and each of the multi-stage first flip-flops updates a holding value at an update cycle twice an update cycle of a previous stage first flip-flop, and each of the plurality of compensation circuits includes two second flip-flops connected to the power supply and each of the two second flip-flops may update a holding value at the same cycle as that of a first stage first flip-flop. This causes an effect that the holding value is updated at an update cycle twice the update cycle of a previous stage first flip-flop in each of the multi-stage first flip-flops and the holding value is updated at the same cycle as that of the first stage first flip-flop in each of the second flip-flops. Further, in the first aspect, each of the plurality of compensation circuits may include a circuit that performs the same counting operation as that of the counter circuit as a dummy counter. This causes an effect that the greater the number of the counter circuits that stop, the greater the number of the dummy counters that operate. Further, in the first aspect, each of the plurality of compensation circuits may include a constant current output unit that outputs a constant output current when the constant current output unit is instructed to output an output current and an output control unit which is associated with one of the plurality of counter circuits and which instructs the constant current output unit to output the output current when the counter circuit with which the output control unit is associated stops the counting operation. This causes an effect that output of an output current is instructed when the associated counter circuit stops the counting operation.

Further, in the first aspect, the constant current output unit may include a transistor where an input terminal is connected to the power supply, a predetermined bias current is inputted into a control terminal, and the output current is outputted from an output terminal, and a connection control unit that connects the output terminal of the transistor to a reference terminal of which potential is lower than that of the power supply when output of the output current is instructed. This causes an effect that the output terminal of the transistor is connected to the reference terminal of which potential is lower than that of the power supply when output of the output current is instructed. Further, in the first aspect, the compensation circuit may include a bias current input unit that inputs a current including a current of a value obtained by multiplying the count value of the associated counter circuit by a predetermined coefficient and a predetermined reference current into the transistor as the bias current. This causes an effect that a current including a current of a value obtained by multiplying the count value of the associated counter circuit by a predetermined coefficient and a predetermined reference current is inputted into the transistor as the bias current.

Further, in the first aspect, the analog-to-digital conversion device may further include multi-stage holding circuits that change a value of bit data when an enable signal is inputted and hold the bit data when the enable signal is not inputted, a timing control unit that inputs the enable signal into a first stage holding circuit among the multi-stage holding circuits at a predetermined timing, an enable generation unit that generates the enable signal when the bit data is changed in one of the holding circuits and inputs the enable signal into a next stage holding circuit of the holding circuit in which the bit data is changed, and a digital-to-analog conversion unit that converts a digital data including the bit data held by the multi-stage holding circuits into an analog reference signal. Each of the plurality of counting period supply units may supply a period, in which a voltage of one of the analog signal and the reference signal is higher than a voltage of the other signal, as the counting period. This causes an effect that when bit data is changed in one of the holding circuits, the enable signal is inputted into the next stage holding circuit of the holding circuit in which the bit data is changed.

Further, in the first aspect, the enable generation unit may include a plurality of enable generation circuits, each of which is associated with the holding circuit different from each other, and the enable generation circuit may include a logical gate that generates the enable signal when the bit data held by the previous stage holding circuit of the holding circuit with which the enable generation circuit is associated is updated to the predetermined value, an output unit that outputs the generated enable signal to the holding circuit with which the enable generation circuit is associated in a period from when a predetermined output control signal is inputted to when the output control signal is inputted next time, and an output control unit that generates the output control signal and inputs the output control signal into the output unit when the enable signal is inputted into the previous stage holding circuit of the holding circuit with which the enable generation circuit is associated or when the enable signal is inputted into the holding circuit with which the enable generation circuit is associated. This causes an effect that the enable signal is outputted to the holding circuit with which the enable generation circuit is associated in a period from when the enable signal is inputted into the previous stage holding circuit of the holding circuit with which the enable generation circuit is associated to when the enable signal is inputted into the holding circuit with which the enable generation circuit is associated.

A second aspect of the present technique is an analog-to-digital conversion device including a plurality of column cells that are connected to a common power supply, in which each of the plurality of column cells includes a comparator that compares voltages of an analog signal and a ramp signal and outputs a comparison result, a counter circuit which is connected to the comparator and which performs a counting operation based on the comparison result, and a compensation circuit which is connected to the comparator and which operates when the counter circuit stops the counting operation. This causes an effect that the compensation circuit operates when the counter circuit stops the counting operation.

A third aspect of the present technique is an image pickup element including a plurality of pixels that output an analog signal, a plurality of counting period supply units that supply a period of length according to a voltage of the analog signal inputted into each counting period supply unit from the pixel based on the voltage of the analog signal as a counting period, a plurality of counter circuits which are connected to a common power supply and which perform a counting operation that counts a count value in the counting period different from each other and generate a digital signal indicating the count value, and a plurality of compensation circuits which are connected to the power supply and which operate so that the greater the number of counter circuits that stop the counting operation among the plurality of counter circuits, the greater the number of the compensation circuits that operate. This causes an effect that the greater the number of the counter circuits that stop, the greater the number of the compensation circuits that operate.

A fourth aspect of the present technique is an image pickup device including a plurality of pixels that output an analog signal, a plurality of counting period supply units that supply a period of length according to a voltage of the analog signal inputted into each counting period supply unit from the pixel based on the voltage of the analog signal as a counting period, a plurality of counter circuits which are connected to a common power supply and which perform a counting operation that counts a count value in the counting period different from each other and generate a digital signal indicating the count value, a plurality of compensation circuits which are connected to the power supply and which operate so that the greater the number of counter circuits that stop the counting operation among the plurality of counter circuits, the greater the number of the compensation circuits that operate, and an image processing unit that processes image data including the digital signal. This causes an effect that the greater the number of the counter circuits that stop, the greater the number of the compensation circuits that operate.

Advantageous Effects of Invention

According to an embodiment of the present technique, while a plurality of counters are operating, even if some of the counters stop, it is possible to obtain an excellent effect that the analog-to-digital conversion can be correctly performed. The effect described here is not necessarily limited, but the effect may be one of the effects described in the present disclosure.

BRIEF DESCRIPTION OF DRAWINGS

FIG. 5 is a diagram showing an example of an operation table of the flip-flop of the first embodiment.

FIG. 6 is a diagram showing an example of an operation table of an upper latch of the first embodiment.

FIG. 15 is a diagram showing an example of an operation table of the bit data holding circuit of the second embodiment.

FIG. 16 is a diagram showing an example of an operation table of the enable generation circuit of the second embodiment.

FIGS. 18A and 18B are diagrams for explaining current consumption of the digital data generation unit of the second embodiment.

DESCRIPTION OF EMBODIMENTS

Hereinafter, modes for carrying out the present technique (hereinafter referred to as embodiments) will be described. The order of the description is as follows:

1. First Embodiment (an example in which when a counter circuit stops, a corresponding compensation circuit operates).
2. Second Embodiment (an example in which when an enable signal is inputted, a bit data is updated, and when a counter circuit stops, a corresponding compensation circuit operates).

1. First Embodiment

Configuration Example of Image Pickup Device

Figure 1:
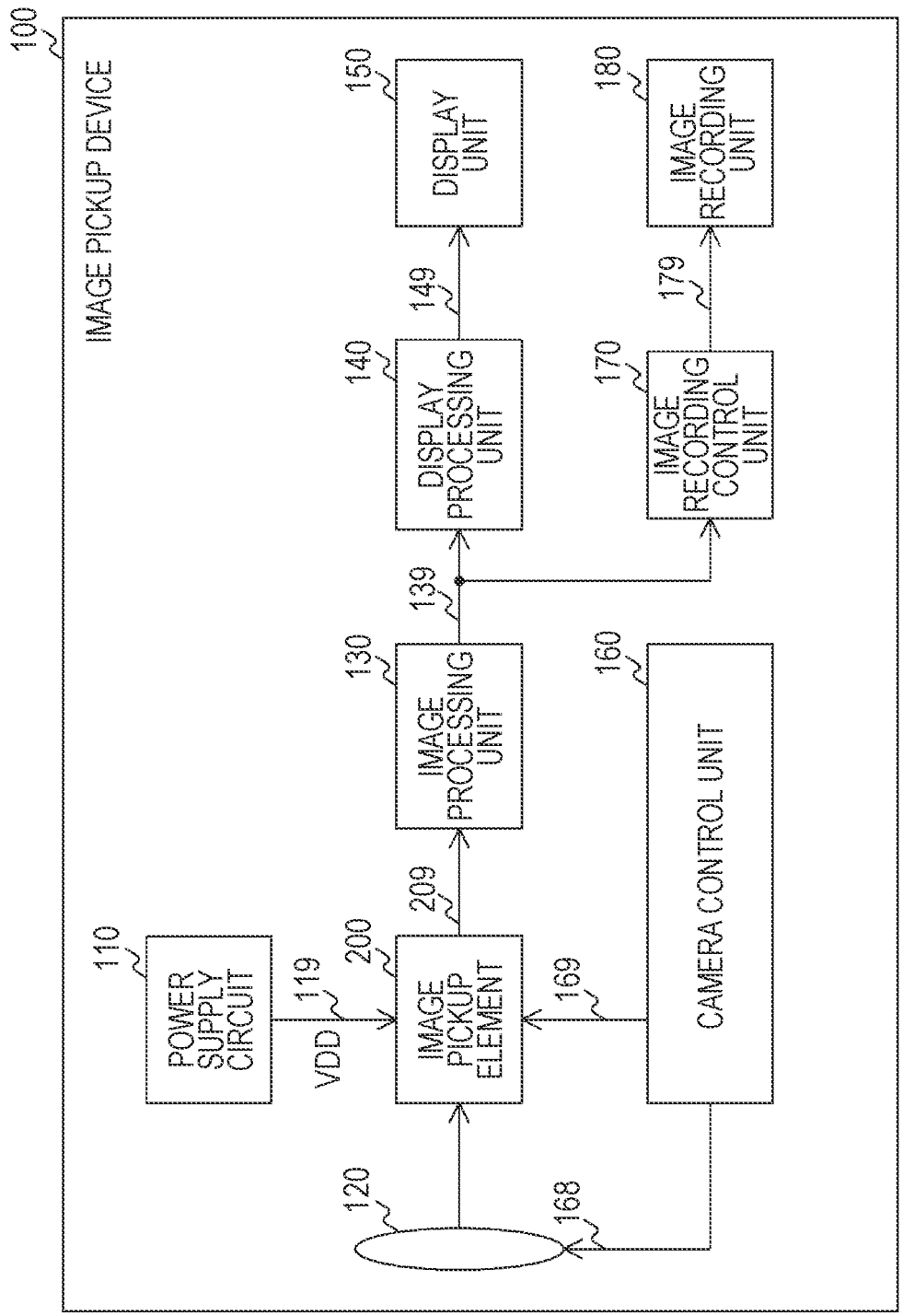
FIG. 1 is a block diagram showing a configuration example of an image pickup device of a first embodiment.

FIG. 1 is a block diagram showing a configuration example of an image pickup device 100 of a first embodiment. The image pickup device 100 is a device that picks up image data and is, for example, a digital camera and a video camera. The image pickup device 100 includes a power supply circuit 110, an image pickup lens 120, an image processing unit 130, a display processing unit 140, a display unit 150, a camera control unit 160, an image recording control unit 170, an image recording unit 180, and an image pickup element 200.

The power supply circuit 110 supplies power to the image pickup element 200 through a power supply line 119. The image pickup lens 120 collects object light and guides the object light to the image pickup element 200.

The image pickup element 200 generates image data from the light received through the image pickup lens 120 according to control of the camera control unit 160. The image pickup element 200 outputs the generated image data to the image processing unit 130 through a signal line 209.

The image processing unit 130 performs image processing such as demosaic processing and white balance processing on the image data from the image pickup element 200. The image processing unit 130 outputs the processed image data to the display processing unit 140 and the image recording control unit 170 through a signal line 139.

The display processing unit 140 performs display processing such as gamma correction processing, color correction processing, or contrast adjustment processing on the image data as needed. The display processing unit 140 outputs the image data after the display processing to the display unit 150 through a signal line 149. The display unit 150 displays the image data from the display processing unit 140.

The camera control unit 160 controls the entire image pickup device 100. The camera control unit 160 outputs a control signal to the image pickup element 200 through a signal line 169 according to an operation of a user and causes the image pickup element 200 to generate image data.

The image recording control unit 170 causes the image recording unit 180 to record the image data from the image processing unit 130. The image recording unit 180 records the image data.

Configuration Example of Image Pickup Element

Figure 2:
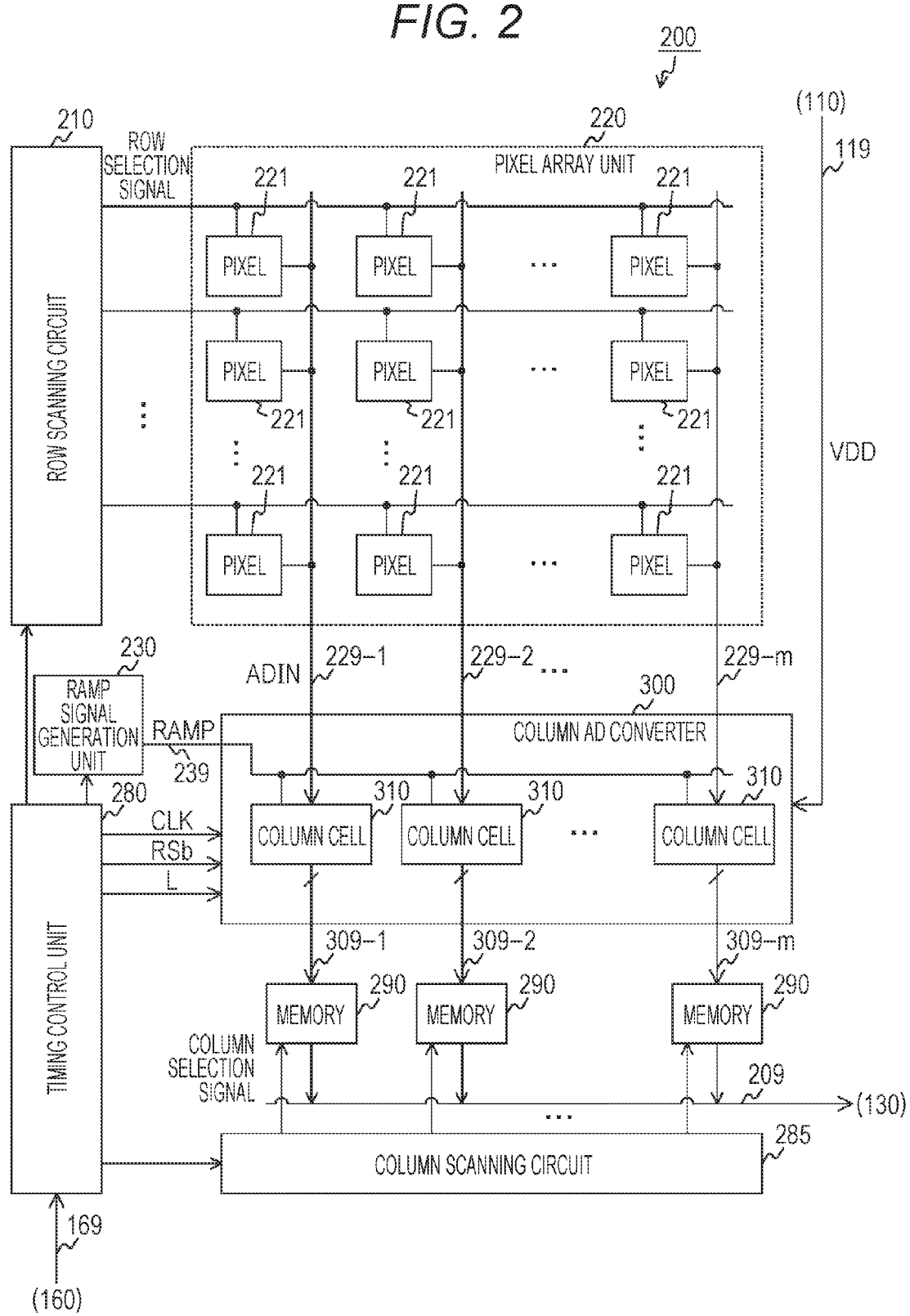
FIG. 2 is a block diagram showing a configuration example of an image pickup element of the first embodiment.

FIG. 2 is a block diagram showing a configuration example of the image pickup element 200 of the first embodiment. The image pickup element 200 includes a row scanning circuit 210, an pixel array unit 220, a ramp signal generation unit 230, a timing control unit 280, a plurality of memories 290, a column scanning circuit 285, and a column AD converter 300. The pixel array unit 220 includes a plurality of pixels 221 arranged in a two-dimensional lattice pattern.

The timing control unit 280 controls output timing of the image data according to the control of the camera control unit 160. The timing control unit 280 controls row and column scanning timing by outputting a timing signal indicating the timing of scanning. Here, the row is a section in which a plurality of pixels 221 are arranged in one direction in the pixel array unit 220 and the column is a section in which a plurality of pixels 221 are arranged in a direction perpendicular to the row in the pixel array unit 220.

The timing control unit 280 controls the ramp signal generation unit 230 and causes the ramp signal generation unit 230 to generate an analog ramp signal RAMP. Further, the timing control unit 280 generates a clock signal CLK, a reset signal RSb, and a data latch signal L and supplies these signals to the column AD converter 300. The clock signal CLK is a clock signal for operating a counter used for AD conversion. The frequency of the clock signal CLK is set to a value that satisfies the following formula.

$$F_{AD} \geq (2^N + M)/T_{AD} \qquad \text{Formula 1}$$

In Formula 1, $F_{AD}$ is the frequency of the clock signal CLK and its unit is, for example, hertz (H). N is a value indicating the resolution of the AD conversion. M is an operation margin of the counting operation. $T_{AD}$ is a time for which the AD conversion is allowed. For example, a reciprocal number of the number of row scanning times per second is set to $T_{AD}$. The unit of $T_{AD}$ is, for example, second.

As shown in Formula 1, in general, the higher the accuracy (resolution) of the AD conversion, the higher the operation speed is desired. The higher the accuracy, the greater the circuit scale of the counter, so that the current consumption during a counting operation increases significantly. On the other hand, when the counting operation is stopped, most of the counters do not operate, so that the current consumption is extremely low. The current change at the time when the counters transfer from an operation state to a stop state is sharp, and the higher the accuracy of AD conversion, the greater the time rate of change of the current dI/dt.

The reset signal RSb is a signal that indicates timing of initializing the count value of the counter. The data latch signal L is a signal that indicates timing of outputting the count value. The reset signal RSb and the data latch signal L are generated in synchronization with, for example, the timing of scanning of a row.

The row scanning circuit 210 sequentially selects each of the rows at a constant cycle according to the control of the timing control unit 280. The row scanning circuit 210 selects each row by sequentially outputting a row selection signal to each of the rows in an image pickup period.

When the row selection signal is inputted into the pixel 221, the pixel 221 generates an analog signal ADIN having a potential according to the amount of received light.

The pixels 221 output the analog signal ADIN to the column AD converter 300 through a signal line of a corresponding column among vertical signal lines 229-1 to 229-m. Here, m is an integer greater than or equal to 2 and corresponds to the number of columns of the pixels. The ramp signal generation unit 230 generates the ramp signal RAMP according to the control of the timing control unit 280. The ramp signal generation unit 230 supplies the generated ramp signal to the column AD converter 300.

The column AD converter 300 converts m analog signals ADIN into digital signals. The column AD converter 300 includes m column cells 310. These column cells 310 are commonly connected to the power supply circuit 110. The column cell 310 is provided for each column. Each column cell 310 receives the analog signal ADIN through a corresponding signal line among the vertical signal lines 229-1 to 229-m, converts the signal into a digital signal, and supplies the digital signal to the memory 290. The column AD converter 300 is an example of an analog-to-digital conversion device described in claims.

The memory 290 holds the digital signal. The memory 290 is provided for each column. Each memory 290 receives the analog signal ADIN from a corresponding column cell 310 and holds the analog signal ADIN. When a column selection signal is inputted into the memory 290, the memory 290 outputs held data to the image processing unit 130 through the signal line 209.

The column scanning circuit 285 reads a digital signal of each pixels in a row by the column selection signal according to the control of the timing control unit 280. Data including these digital signals is outputted to the image processing unit 130 as image data.

Although the column AD converter 300 is provided in the image pickup device 100, the column AD converter 300 may be provided in an apparatus or a device other than the image pickup device, such as an X-ray inspection device.

Configuration Example of Ramp Signal Generation Unit

Figure 3:
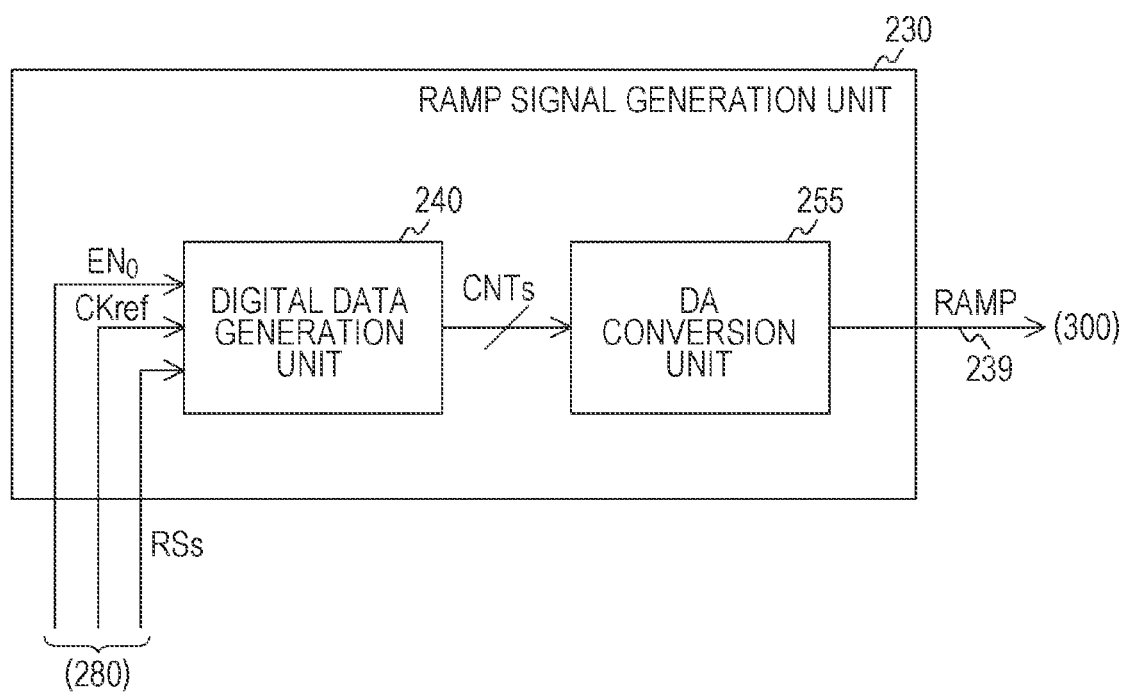
FIG. 3 is a block diagram showing a configuration example of a ramp signal generation unit of the first embodiment.

FIG. 3 is a block diagram showing a configuration example of the ramp signal generation unit 230 of the first embodiment. The ramp signal generation unit 230 includes a digital data generation unit 240 and a DA (Digital to Analog) conversion unit 255.

The digital data generation unit 240 generates digital data indicating a voltage of the ramp signal RAMP according to the control of the timing control unit 280. An enable signal $EN_0$, a reset signal RSs, and a reference clock signal CKref, which are generated by the timing control unit 280, are inputted into the digital data generation unit 240. Here, the enable signal $EN_0$ is a signal indicating the timing when the voltage of the ramp signal RAMP begins to rise. For example, the enable signal $EN_0$ is set to a high level at the timing when the ramp signal RAMP begins to rise and is set to a low level in a period other than the above timing. The reset signal RSb is a signal that indicates the timing when the voltage of the ramp signal RAMP is reset. For example, the reset signal RSs is set to a high level at the timing when the voltage of the ramp signal RAMP is reset and is set to a low level in a period other than the above timing.

When a high level enable signal $EN_0$ is inputted into the digital data generation unit 240, the digital data generation unit 240 starts a predetermined counting operation in synchronization with the reference clock signal CKref and supplies digital data indicating its count value to the DA conversion unit 255. When a high level reset signal RSs is inputted into the digital data generation unit 240, the digital data generation unit 240 sets the digital data to an initial value.

The DA conversion unit 255 converts the digital data from the digital data generation unit 240 into an analog ramp signal RAMP. The DA conversion unit 255 supplies the ramp signal RAMP to the column AD converter 300 through a signal line 239.

Configuration Example of Digital Data Generation Unit

Figure 4A:
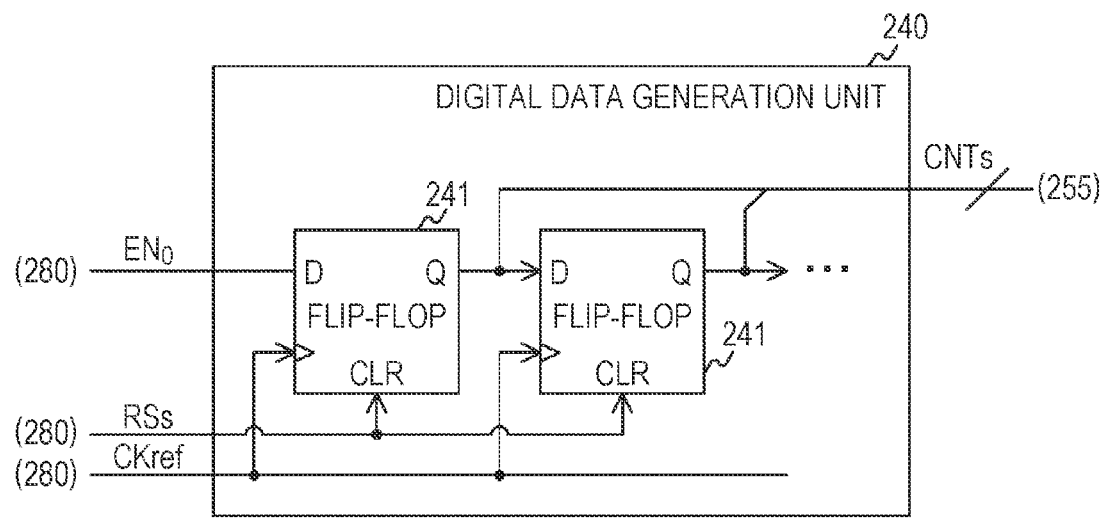
FIGS. 4A to 4B are circuit diagrams showing a configuration example of a digital data generation unit and a flip-flop of the first embodiment.
Figure 4B:
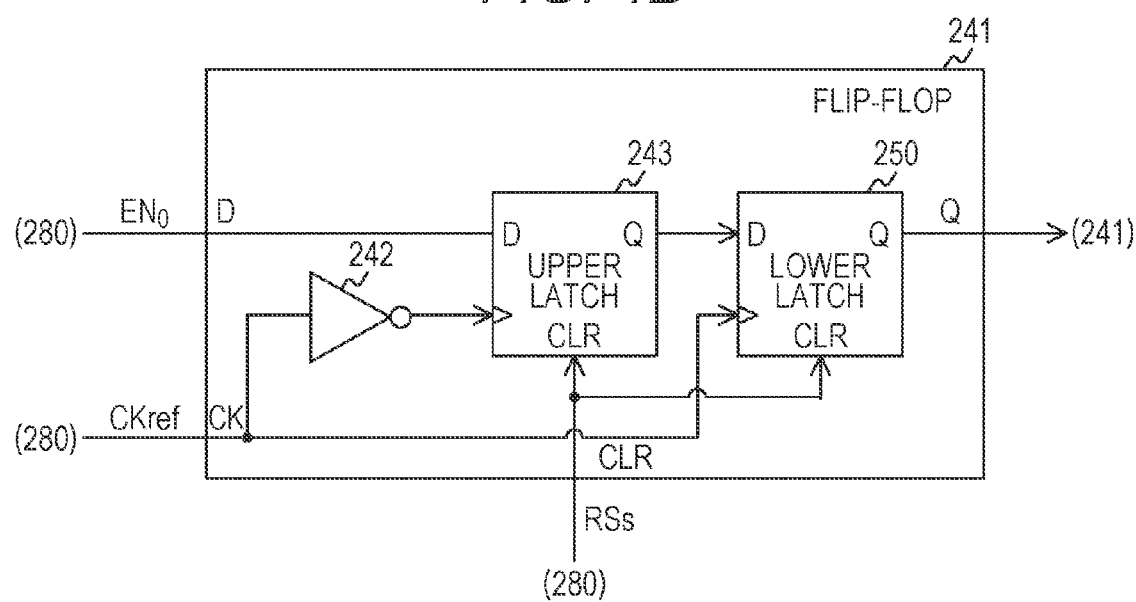

FIGS. 4A and 4B are circuit diagrams showing a configuration example of the digital data generation unit 240 and a flip-flop 241 of the first embodiment. FIG. 4A is a circuit diagram showing a configuration example of the digital data generation unit 240. The digital data generation unit 240 includes multi-stage flip-flops 241. The flip-flop 241 holds bit data and updates the value of the bit data in synchronization with the reference clock signal CKref. Each of the flip-flops 241 includes a data input terminal D, a clock terminal CK, a data output terminal Q, and a clear terminal CLR.

The enable signal $EN_0$ is inputted into the data input terminal D of a first stage flip-flop 241, and the data output terminal Q of the first stage flip-flop 241 is connected to the data input terminal D of the next stage flip-flop and the DA conversion unit 255. Further, the data input terminal D of the second and the following stage flip-flops 241 is connected to the data output terminal Q of a previous stage flip-flop 241, and the data output terminal Q of the second and the following stage flip-flops 241 is connected to the data input terminal D of a next stage flip-flop 241 and the DA conversion unit 255. The data input terminal D of the last stage flip-flop 241 is connected to the data output terminal Q of the previous stage flip-flop 241, and the data output terminal Q of the last stage flip-flop 241 is connected to the DA conversion unit 255. The reference clock signal CKref is inputted into the clock terminal CK of all the flip-flops 241 and the reset signal RSs is inputted into the clear terminal CLR of all the flip-flops 241.

Each flip-flop 241 updates bit data by data from the previous stage in synchronization with the reference clock signal CKref and outputs the bit data to the next stage. By this configuration, when the enable signal $EN_0$ having a value of "1" is inputted into the first stage, the value is shifted to the next stage in synchronization with the reference clock signal CKref. Such a circuit is generally called a shift register.

FIG. 4B is a circuit diagram showing a configuration example of the flip-flop 241. The flip-flop 241 includes an inverter 242, an upper latch 243, and a lower latch 250.

The inverter 242 inverts the reference clock signal CKref and supplies the inverted reference clock signal CKref to the upper latch 243.

The upper latch 243 and the lower latch 250 hold bit data and update the value of the bit data in synchronization with a clock signal. Each of the latches includes a data input terminal D, a data output terminal Q, a clock terminal CK, and a clear terminal CLR.

The data input terminal D of the upper latch 243 is connected to the data input terminal D of the flip-flop 241 including the upper latch 243. The data output terminal Q of the upper latch 243 is connected to the data input terminal D of the lower latch 250, and the inverted reference clock signal CKref is inputted into the clock terminal CK of the upper latch 243.

The data output terminal Q of the lower latch 250 is connected to the data output terminal Q of the flip-flop 241 including the lower latch 250. The reference clock signal CKref is inputted into the clock terminal CK of the lower latch 250. Further, the reset signal RSs is inputted into the clear terminal CLR of each of the upper latch 243 and the lower latch 250.

FIG. 5 is a diagram showing an example of an operation table of the flip-flop 241 of the first embodiment. At the rising edge of a signal inputted into the clock terminal CK, the flip-flop 241 updates bit data by data inputted into the data input terminal D and outputs the updated bit data from the data output terminal Q. When no rising edge is inputted into the clock terminal CK, the flip-flop 241 holds data of the previous state. When a high level signal is inputted into the clear terminal CLR, the flip-flop 241 sets the bit data to an initial value (for example "0").

FIG. 6 is a diagram showing an example of an operation table of the upper latch 243 of the first embodiment. When a high level signal is inputted into the clock terminal CK, the upper latch 243 updates bit data by data inputted into the data input terminal D and outputs the updated bit data from the data output terminal Q. When a signal inputted into the clock terminal CK is low level, the upper latch 243 holds data of the previous state. When a high level signal is inputted into the clear terminal CLR, the upper latch 243 sets the bit data to an initial value (for example "0"). The operation of the lower latch 250 is the same as that of the upper latch 243.

Configuration Example of Latch

Figure 7A:
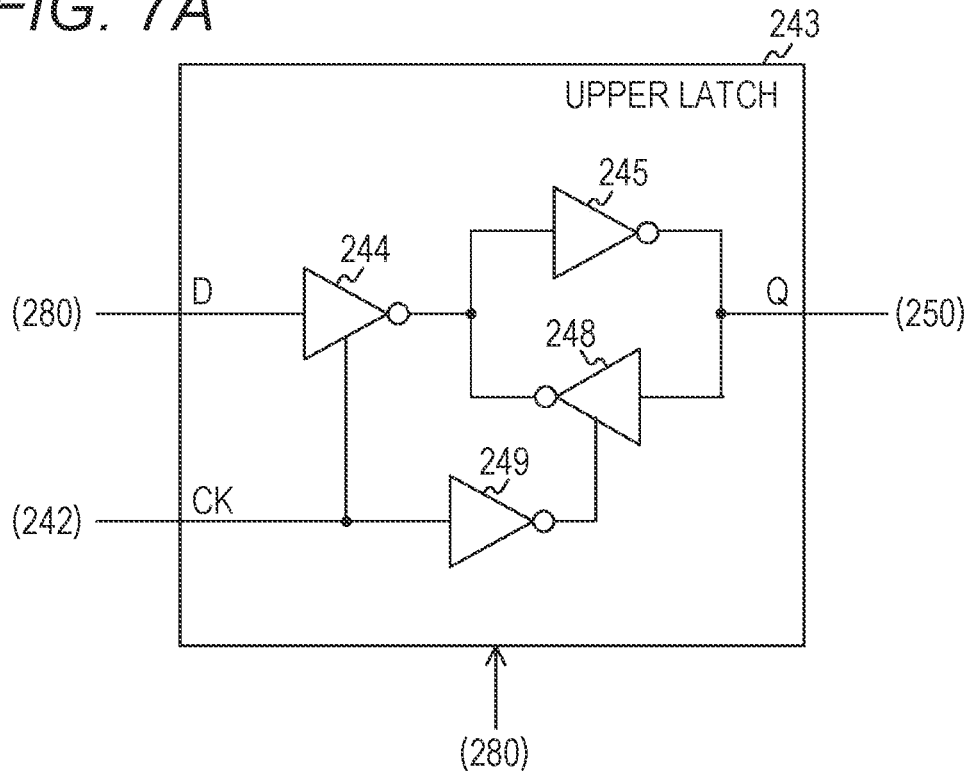
FIGS. 7A to 7B are circuit diagrams showing a configuration example of the upper latch and an inverter of the first embodiment.
Figure 7B:
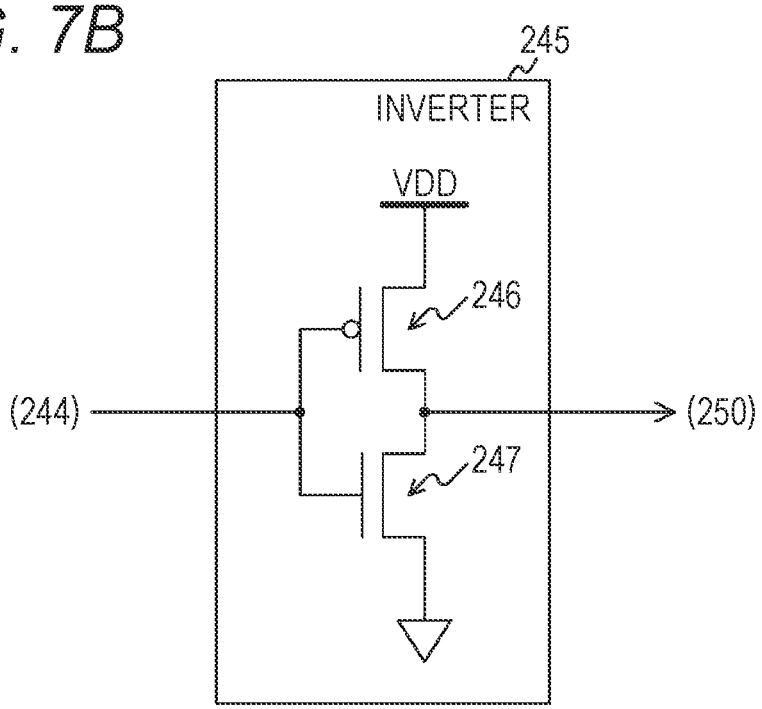

FIGS. 7A and 7B are circuit diagrams showing a configuration example of the upper latch 243 and an inverter 245 of the first embodiment. FIG. 7A is a circuit diagram showing a configuration example of the upper latch 243. The upper latch 243 includes inverters 244, 245, 248, and 249. In FIG. 7A, a circuit for initializing a holding value is omitted. The configuration of the lower latch 250 is the same as that of the upper latch 243.

The input terminal of the inverter 244 is connected to the data input terminal D, the output terminal of the inverter 244 is connected to the inverters 245 and 248, and the control terminal of the inverter 244 is connected to the clock terminal CK.

The input terminal of the inverter 245 is connected to the inverters 244 and 248, and the output terminal of the inverter 245 is connected to the inverter 248 and the data output terminal Q. The input terminal of the inverter 248 is connected to the inverter 245 and the data output terminal Q, the output terminal of the inverter 248 is connected to the inverters 244 and 245, and the control terminal of the inverter 248 is connected to the inverter 249. The input terminal of the inverter 249 is connected to the clock terminal CK, and the output terminal of the inverter 249 is connected to the inverter 248.

When a high level signal is inputted into the control terminal of the inverters 244 and 248, the inverters 244 and 248 invert the signal inputted into the input terminal and output the inverted signal.

By this configuration, when a high level signal is inputted into the clock terminal CK, a signal inputted into the data input terminal D is outputted from the data output terminal Q through the inverters 244 and 245.

On the other hand, when a low level signal is inputted into the clock terminal CK, bit data is held by a circuit including the inverters 245 and 248.

FIG. 7B is a circuit diagram showing a configuration example of the inverter 245. The inverter 245 includes transistors 246 and 247. For example, a p-type MOS transistor is used as the transistor 246 and an n-type MOS transistor is used as the transistor 247. The gate terminal of the transistor 246 is connected to the input terminal of the inverter 245 and the transistor 247, the source terminal of the transistor 246 is connected to the output terminal of the inverter 245 and transistor 247, and the drain terminal of the transistor 246 is connected to the power supply. The gate terminal of the transistor 247 is connected to the input terminal of the inverter 245 and the transistor 246, the source terminal of the transistor 247 is connected to the output terminal of the inverter 245 and transistor 246, and the drain terminal of the transistor 247 is grounded.

For example, when a high level signal is inputted into the inverter 245, the ground-side transistor 247 transfers to on state, the power-supply-side transistor 246 transfers to off state, and a low level signal is outputted. When the inputted signal changes from a high level to a low level, the ground-side transistor 247 transfers from on state to off state, the power-supply-side transistor 246 transfers from off state to on state, and a high level signal is outputted. In this way, when a level of the input signal into the inverter 245 changes, the transistors 246 and 247 switch from either of the on and off states to the other state. However, it takes a delay time for the transistors to switch the state, so that both of these transistors become on state for a short time and a relatively large through-current flows. Further, when the clock signal inputted into the upper latch 243 changes from one of the high and low levels to the other level, the aforementioned through-current flows through the inverter 249. Further, when the upper latch 243 updates the holding value, the through-current flows through the inverters 244, 245, and 248. In the same manner, the through-current flows through the flip-flop 241 including the upper latch 243 when the clock signal changes and the holding value is updated.

Configuration Example of Column Cell

Figure 8:
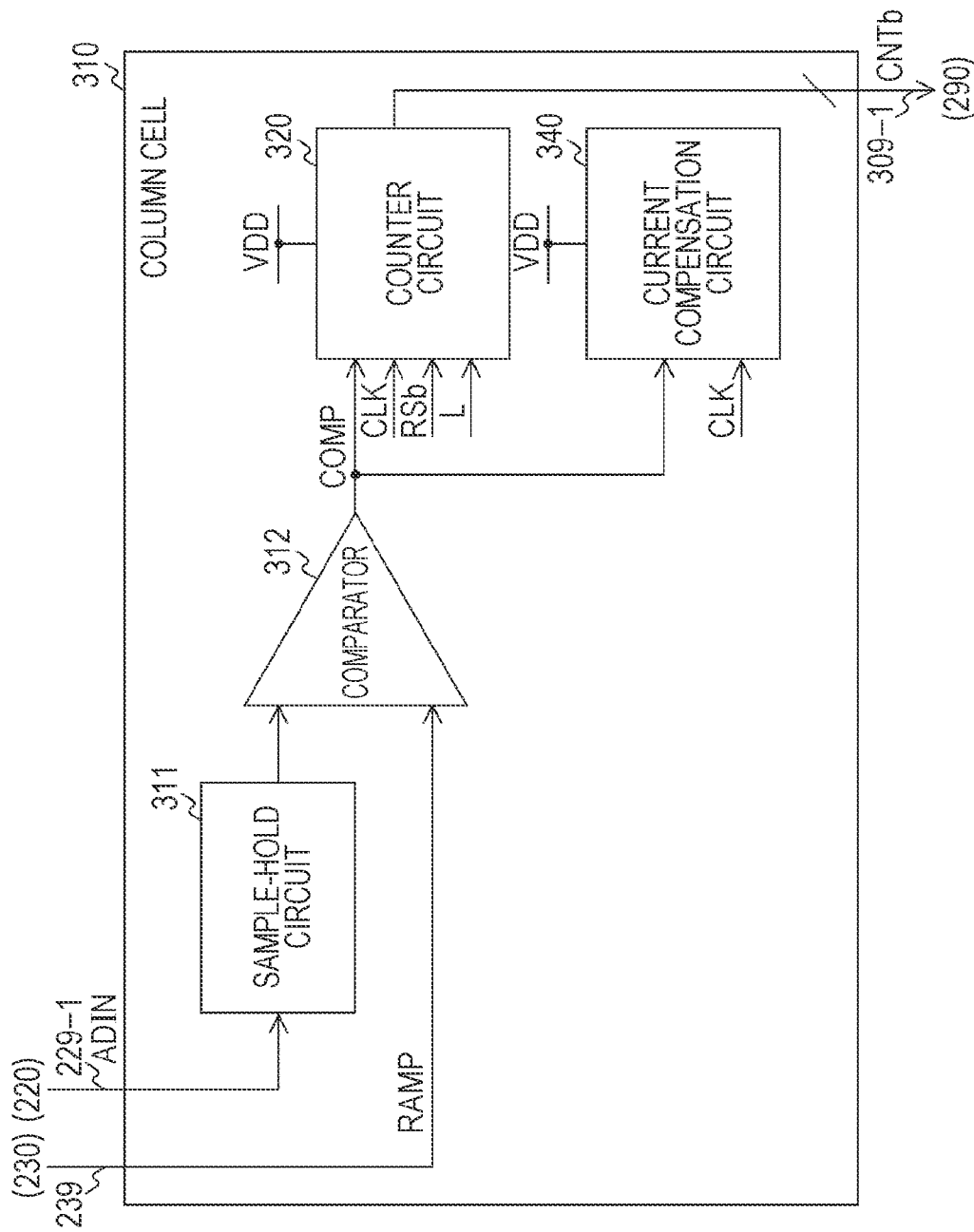
FIG. 8 is a block diagram showing a configuration example of a column cell of the first embodiment.

FIG. 8 is a block diagram showing a configuration example of the column cell 310 of the first embodiment. The column cell 310 includes a sample-hold circuit 311, a comparator 312, a counter circuit 320, and a current compensation circuit 340.

The sample-hold circuit 311 measures and holds the analog signal ADIN at the scanning timing of row. The sample-hold circuit 311 supplies the held analog signal ADIN to the comparator 312.

The comparator 312 compares voltages of the analog signal ADIN and the ramp signal RAMP. The comparator 312 supplies a comparison signal COMP that indicates the comparison result to the counter circuit 320. For example, when the voltage of the analog signal ADIN is higher than the voltage of the ramp signal RAMP, a high level comparison signal COMP is outputted, and otherwise a low level comparison signal COMP is outputted. The comparison signal COMP indicates a counting period in which the counter circuit 320 performs a counting operation and, for example, the counting is performed in a period when the comparison signal COMP is high level. The comparator 312 is an example of a counting period supply unit described in claims.

The counter circuit 320 performs a predetermined counting operation in the counting period. The comparison signal COMP, the clock signal CLK, the reset signal RSb, and the data latch signal L are inputted into the counter circuit 320.

The counter circuit 320 performs the counting operation in synchronization with the clock signal CLK in a period in which the high level comparison signal COMP is inputted. The counter circuit 320 sets the count value CNTb to an initial value according to the reset signal RSb and outputs a digital signal indicating the count value CNTb to the memory 290 according to the data latch signal L.

The current compensation circuit 340 operates when the counter circuit 320 stops. For example, the current compensation circuit 340 operates in synchronization with the clock signal CLK in a period in which the low level comparison signal COMP is inputted. The current compensation circuit 340 is an example of a compensation circuit described in claims.

Configuration Example of Counter Circuit

Figure 9:
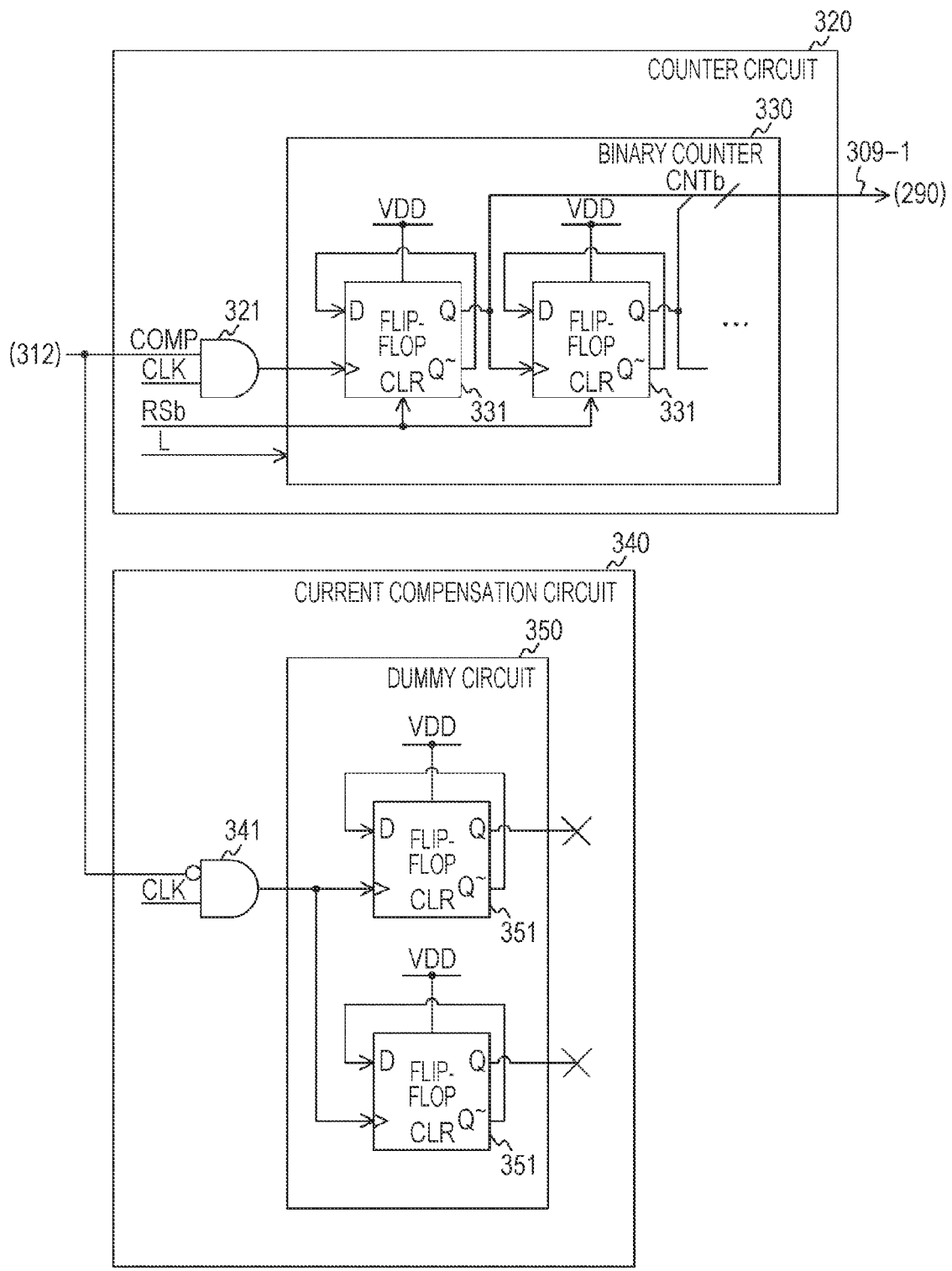
FIG. 9 is a block diagram showing a configuration example of a counter circuit and a current compensation circuit of the first embodiment.

FIG. 9 is a block diagram showing a configuration example of the counter circuit 320 and the current compensation circuit 340 of the first embodiment. The counter circuit 320 includes an AND (logical product) gate 321 and a binary counter 330.

The AND gate 321 outputs a logical product of input values. The comparison signal COMP and the clock signal CLK are inputted into the AND gate 321. The AND gate 321 outputs a signal indicating the logical product of these signals to the binary counter 330.

The binary counter 330 counts a binary value. The binary counter 330 includes N stages of flip-flops 331 (N is an integer greater than or equal to 2). Each of the flip-flops 331 includes a data input terminal D, a clock terminal CK, a data output terminal Q, and an inverted data output terminal Q~. The operation of the flip-flops 331 is the same as that of the flip-flop 241 illustrated in FIG. 5 except that the inverted data output terminal Q~ outputs a signal different from the signal outputted from the data output terminal Q.

The clock terminal CK of the first stage flip-flop 331 is connected to the AND gate 321, the data input terminal D of the first stage flip-flop 331 is connected to the inverted data output terminal Q~, and the data output terminal Q of the first stage flip-flop 331 is connected to the second stage flip-flop 331 and the memory 290.

The clock terminal CK of each of the second and the following stage flip-flops 331 is connected to a previous stage flip-flop 331, the data input terminal D of each of the flip-flops 331 is connected to the inverted data output terminal Q~, and the data output terminal Q of each of the flip-flops 331 is connected to a next stage flip-flop 331 and the memory 290. The clock terminal CK of the last stage flip-flop 331 is connected to the previous stage flip-flop 331, the data input terminal D of the last stage flip-flop 331 is connected to the inverted data output terminal Q~, and the data output terminal Q of the last stage flip-flop 331 is connected the memory 290. The reset signal RSb is inputted into the clear terminals of all the flip-flops 331. In FIG. 9, a configuration that outputs data according to the data latch signal L is omitted.

By this configuration, the binary counter 330 counts the binary count value CNTb in synchronization with the clock signal CLK in a period in which the comparison signal COMP is high level. Every time the count value CNTb increases or decreases, the aforementioned through-current flows, so that a current consumed when the counter circuit 320 performs the counting operation is larger than that consumed when the counting operation is stopped.

The higher the operating frequency (in other words, the shorter the update cycle of holding value), the larger the current consumption of each flip-flop 331. The update cycle of each flip-flop 331 is twice the update cycle of the previous stage, so that the current consumption is ½ of the previous stage. When the current consumption of the first stage flip-flop 331 is Iop, the current consumption Itotal of the entire binary counter 330 including N stages of flip-flop 331 is obtained by the following formula:

[Mathematical Formula 1]

$$I_{total} = Iop \times \left(1 + \frac{1}{2} + \frac{1}{4} + \frac{1}{8} + \ldots + \frac{1}{2^{N-1}}\right) = Iop \times \sum_{i=1}^{N} \frac{1}{2^{i-1}} \approx 2Iop.$$

In Formula 2, the unit of Itotal and Iop is, for example, ampere (A).

The current compensation circuit 340 includes an AND gate 341 and a dummy circuit 350. The AND gate 341 outputs a logical product of input values. A signal obtained by inverting the comparison signal COMP and the clock signal CLK are inputted into the AND gate 341. The AND gate 321 outputs a signal indicating the logical product of these signals to the dummy circuit 350.

The dummy circuit 350 includes two flip-flops 351. The clock terminal CK of these flip-flops 351 is connected to the AND gate 341, the data input terminal D of the flip-flops 351 is connected to the inverted data output terminal Q~, and the data output terminal Q of the flip-flops 351 is processed by open processing which causes the data output terminal Q to be unconnected.

By this configuration, the current compensation circuit 340 operates in synchronization with the clock signal CLK in a period in which the comparison signal COMP is low level. The operating frequencies of the flip-flops 351 in the current compensation circuit 340 are the same as the frequency of the first stage flip-flop 331, so that the current consumption of the flip-flop 351 is also Iop. As illustrated in Formula 2, the current consumption Itotal of the entire binary counter 330 is approximately the same as 2×Iop, so that the current consumption of the entire dummy circuit 350 is approximately the same as the current consumption of the entire binary counter 330.

In this way, when either one of the counter circuit 320 and the current compensation circuit 340, current of which consumptions are approximately the same, stops, the other one operates, so that the variation of the current consumption of the entire column cell 310 including these circuits is suppressed. In the same manner, the variation of the current consumption of the entire column AD converter 300 including a plurality of column cells 310 is suppressed.

Variation of the current consumption of the column AD converter 300 is suppressed, so that even when many counter circuits 320 stop at the same time, a transient voltage drop LdI/dt generated by an inductance component is suppressed. Therefore, it is possible to prevent malfunction of the counter circuits 320 that are still operating in the column AD converter 300. Thereby, the column AD converter 300 can correctly perform analog-to-digital conversion.

As described above, the higher the accuracy (resolution) of the AD conversion, the steeper the current variation. However, the current variation is reduced by the operation of the current compensation circuit 340, so that it is possible to easily realize improvement of the operating frequency of the AD conversion and increase of the resolution of the AD conversion. Further, it is possible to reduce the voltage variation due to increase of the number of the column cells 310, so that it contributes to improvement of spatial resolution of a sensor (the image pickup element 200 and the like). Further, it is possible to reduce the effect of an inductance component in a power supply path by the operation of the current compensation circuit 340, so that when selecting an LSI (Large Scale Integration) package, the degree of freedom in mounting an LSI increases. Therefore, inexpensive manufacturing is possible as compared with a configuration in which the current compensation circuit 340 is not provided. Specifically, in an column AD converter in which the current compensation circuit 340 is not provided, to achieve an stable operation, an LSI package of which inductance component is small and which is represented by a BGA (Ball Grid Array) package is desired. However, in a substrate on which an LSI of such a BGA package is mounted, a via for inputting and outputting a signal to and from a ball terminal is used. To reduce the substrate manufacturing cost, a through-via has to be used. However, members that can be arranged on the back side of the LSI are limited. On the other hand, when manufacturing is performed by using a build-up substrate in order to avoid the through-via, the limitation of mounting on the back side is alleviated. However, it causes an increase of the manufacturing cost. On the other hand, in a configuration in which the current compensation circuit 340 is provided, the effect of the inductance component can be reduced. Therefore, a surface-mountable QFN (Quad For Non-Lead) package or the like of which inductance is relatively large can be used, so that it is possible to have a degree of freedom in designing a substrate.

Figure 10A:
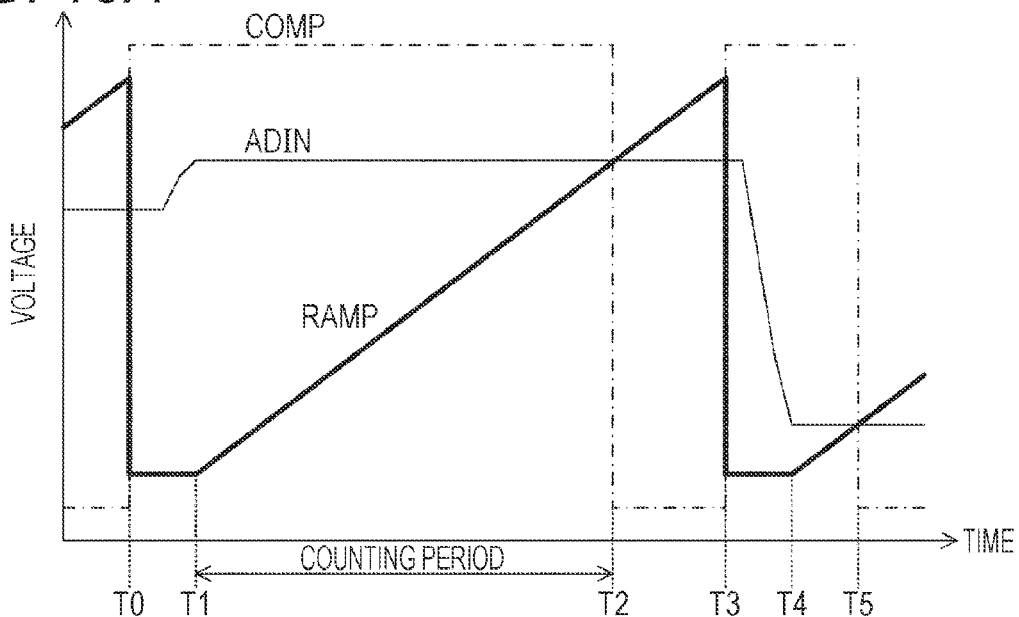
FIGS. 10A to 10E are timing charts showing an example of an operation of the column cell of the first embodiment.

The counter circuit 320 includes the binary counter 330. However, the counter circuit 320 is not limited to this configuration as long as the counter circuit 320 can perform a counting operation. For example, the counter circuit 320 may include a shift register, a Johnson counter, or a gray code counter instead of the binary counter 330. A configuration in which a plurality of types of these counters are combined may be employed. FIGS. 10A to 10E are timing charts showing an example of an operation of the column cell 310 of the first embodiment. FIG. 10A is a graph showing an example of variations of the comparison signal COMP, the analog signal ADIN and the ramp signal RAMP. The vertical axis of FIG. 10A represents voltage of these signals and the horizontal axis represents time.

At a certain time T0, the timing control unit 280 initializes the voltage of the ramp signal RAMP. By this initialization, at the time T0, the analog signal ADIN is higher than the ramp signal RAMP and the comparison signal COMP is high level.

At a time T1 after a certain period of time has elapsed from the time T0, the timing control unit 280 starts raising the voltage of the ramp signal RAMP. Further, at the time T1, the timing control unit 280 causes the binary counter 330 to start the counting operation by supplying the clock signal CLK.

After the time T1, the voltage of the ramp signal RAMP gradually rises, and at a time T2, the voltage of the ramp signal RAMP becomes higher than the voltage of the analog signal ADIN. Therefore, after the time T2, the comparison signal COMP becomes low level. When the comparison signal COMP becomes low level, the binary counter 330 stops the counting operation.

At a time T3 after a certain period of time has elapsed from the time T0, the timing control unit 280 initializes the voltage of the ramp signal RAMP. By this initialization, at the time T3, the comparison signal COMP becomes high level again. Thereafter, at a time T4, the timing control unit 280 causes the binary counter 330 to start the counting operation.

Figure 10B:
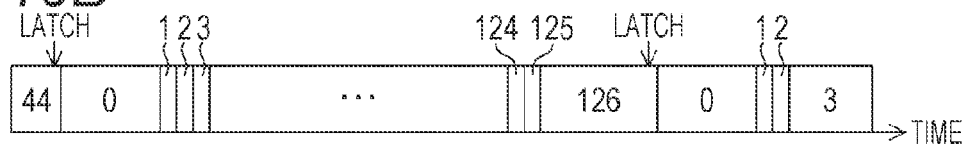

FIG. 10B is a diagram showing an example of the count value CNTb of the binary counter 330. Before the time T1, the count value CNTb is still an initial value (for example "0"). At the time T1, the timing control unit 280 starts supply of the clock signal CLK. Further, at the time T1, the comparison signal COMP is high level, so that the binary counter 330 starts the counting of the count value CNTb. At the time T2, the comparison signal COMP becomes low level, so that the binary counter 330 stops the counting operation. Then, immediately before the time T3, the timing control unit 280 supplies the data latch signal L and the reset signal RSb in order. The binary counter 330 outputs the count value CNTb and then initializes the count value CNTb.

Figure 10C:
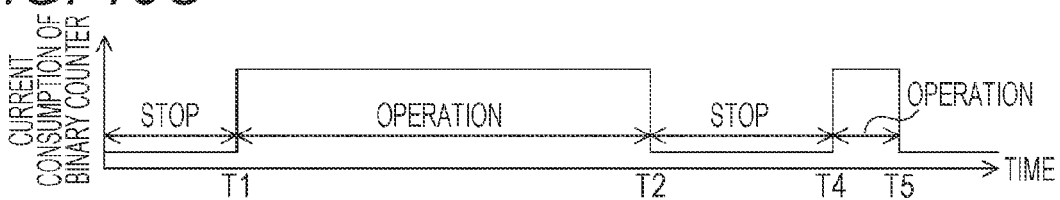

FIG. 10C is a graph showing an example of variation of the current consumption of the binary counter 330. The vertical axis of FIG. 10C represents the current consumption of the binary counter 330 and the horizontal axis represents time. In a period from the time T1 to the time T2, the binary counter 330 performs the counting operation, so that the current consumption increases as compared with a period in which the binary counter 330 stops. In a period before the time T1 and a period from the time T2 to the time T4, the binary counter 330 stops, so that the current consumption decreases as compared with a period in which the binary counter 330 performs the counting operation.

Figure 10D:
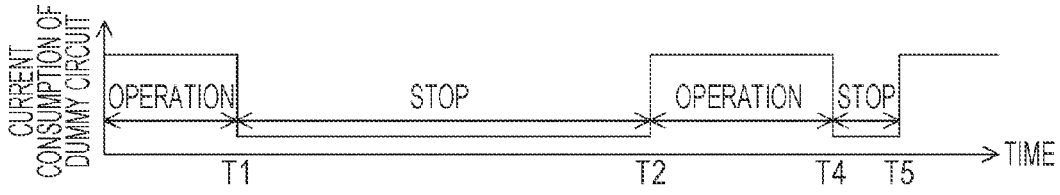

In FIG. 10C, the current consumed while the binary counter 330 is operating varies over time to some extent in practice. However, for convenience of description, it is assumed that the current consumption is constant. FIG. 10D is a graph showing an example of variation of the current consumption of the dummy circuit 350. The vertical axis of FIG. 10D represents the current consumption of the dummy circuit 350 and the horizontal axis represents time. In a period from the time T1 to the time T2, the dummy circuit 350 stops, so that the current consumption decreases as compared with a period in which the dummy circuit 350 is operating. In a period before the time T1 and a period from the time T2 to the time T4, the dummy circuit 350 operates, so that the current consumption increases as compared with a period in which the dummy circuit 350 stops.

Figure 10E:
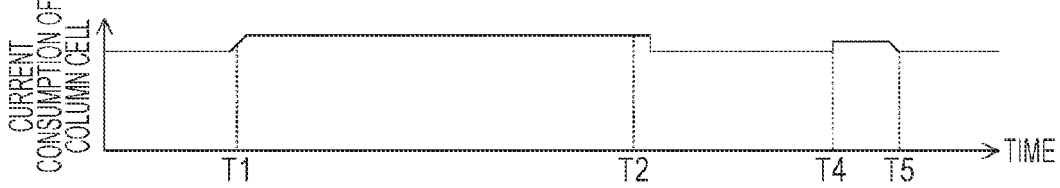

FIG. 10E is a graph showing an example of variation of the current consumption of the entire column cell 310. The vertical axis of FIG. 10D represents the current consumption of the column cell 310 and the horizontal axis represents time. As illustrated in FIGS. 10C and 10D, when one of the binary counter 330 and the dummy circuit 350 stops, the other operates. Therefore, as illustrated in FIG. 10E, the variation of the current consumption of the entire column cell 310 including these circuits is suppressed.

As described above, according to the first embodiment of the present technique, the greater the number of the counter circuits 320 that stop the counting operation, the greater the number of the current compensation circuits 340 that operate, so that it is possible to suppress the variation of the current consumption of the entire column AD converter 300. By this suppression of the variation of the current consumption, the transient voltage drop is suppressed. Therefore, while a plurality of counters are operating, ever if some of the counters stop, the column AD converter 300 can correctly perform the AD conversion.

First Modified Example

In the first embodiment, the current compensation circuit 340 causes the dummy circuit 350 including two flip-flops to operate. However, the current compensation circuit 340 may cause a dummy counter similar to the binary counter 330 to operate instead of the dummy circuit 350. The current compensation circuit 340 of the first modified example is different from the first embodiment in that the current compensation circuit 340 causes the dummy counter to operate.

Figure 11:
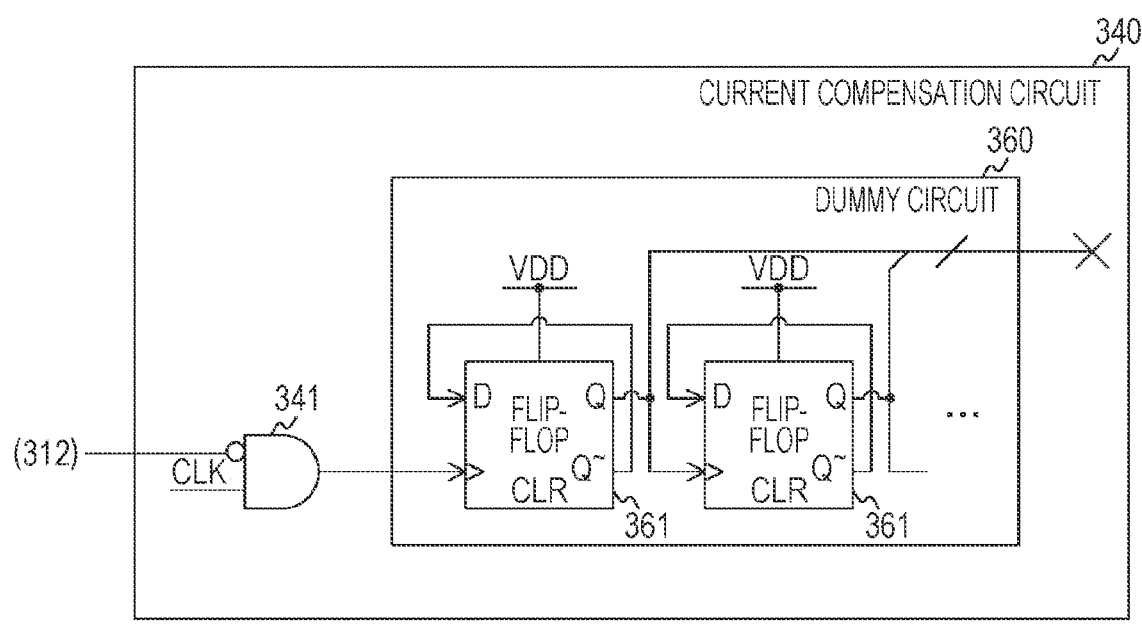
FIG. 11 is a circuit diagram showing a configuration example of a current compensation circuit of a first modified example of the first embodiment.

FIG. 11 is a block diagram showing a configuration example of the current compensation circuit 340 of the first modified example of the first embodiment. The current compensation circuit 340 of the first modified example is different from the first embodiment in that the current compensation circuit 340 includes a dummy counter 360 instead of the dummy circuit 350. The configuration of the dummy counter 360 is the same as that of the binary counter 330.

As illustrated in Formula 2, when the number N of the stages is sufficiently large, the current consumption of the counter circuit 320 can be approximated to the current consumption (2×Iop) of the current compensation circuit 340 of the first embodiment. However, when the number N of the stages is small, in the first embodiment, the difference of current consumption between the counter circuit 320 and the current compensation circuit 340 is large. On the other hand, if a dummy counter that is the same as the counter in the counter circuit 320 is provided as in the first modified example, even when the number N of the stages is small, the current consumption of the current compensation circuit 340 and the current consumption of the counter circuit 320 can be approximately the same.

As described above, according to the first modified example of the first embodiment, the current compensation circuit 340 includes the dummy counter 360, so that it is possible to suppress the variation of the current consumption even when the number of stages of the binary counter 330 is small.

Second Modified Example

In the first embodiment, the current compensation circuit 340 includes the dummy circuit 350 including two flip-flops. However, the current compensation circuit 340 may include a constant current source instead of the dummy circuit 350. The current compensation circuit 340 of the second modified example is different from the first embodiment in that the current compensation circuit 340 includes a constant current source.

Figure 12A:
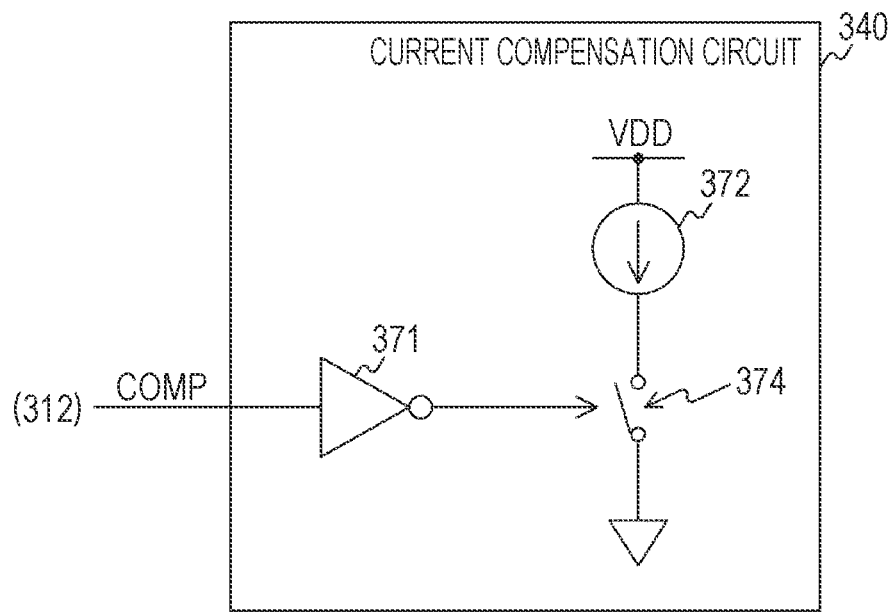
FIGS. 12A and 12B are circuit diagrams showing a configuration example of a current compensation circuit and a constant current source of a second modified example of the first embodiment.
Figure 12B:
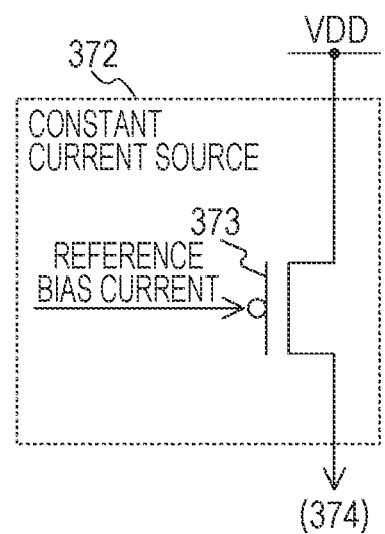

FIGS. 12A and 12B are circuit diagrams showing a configuration example of the current compensation circuit 340 and a constant current source 372 of the second modified example of the first embodiment. FIG. 12A is a circuit diagram showing a configuration example of the current compensation circuit 340 of the second modified example. The current compensation circuit 340 of the second modified example includes an inverter 371, the constant current source 372, and a switch 374.

The inverter 371 inverts and outputs the comparison signal COMP. The constant current source 372 is connected to a power supply (power supply circuit 110) common to the counter circuit 320 and outputs a constant output current to the switch 374. The value of the output current is set to, for example, a value approximately equal to an average current consumption of the binary counter 330. The switch 374 opens and closes a path between the constant current source 372 and a grounding terminal according to the signal from the inverter 371. For example, the switch 374 changes to a closed state when the signal from the inverter 371 is high level, and changes to an open state when the signal is low level.

FIG. 12B is a circuit diagram showing a configuration example of the constant current source 372. The constant current source 372 includes, for example, a transistor 373. For example, a p-type MOS transistor is used as the transistor 373. A constant reference bias current is applied to the gate terminal of the transistor 373, the source terminal of the transistor 373 is connected to the switch 374, and the drain terminal of the transistor 373 is connected to the power supply (power supply circuit 110).

The constant current source 372 may include an element other than the transistor 373. The current compensation circuit 340 may have a configuration that does not include the inverter 371. When the current compensation circuit 340 does not include the inverter 371, the comparison signal COMP is directly supplied to the switch 374. The switch 374 changes to the closed state when the comparison signal COMP is low level, and changes to the open state when the comparison signal COMP is high level. The inverter 371 is an example of an output control unit described in claims. The constant current source 372 and the switch 374 are an example of a constant current output unit described in claims.

As described above, according to the second modified example of the first embodiment, the current compensation circuit 340 includes the constant current source 372, so that it is possible to suppress the variation of the current of the entire column AD converter 300 by consuming a constant current.

Third Modified Example

In the first embodiment, the current compensation circuit 340 includes the dummy circuit 350 including two flip-flops. However, the current compensation circuit 340 may include a constant current source instead of the dummy circuit 350 and correct the current consumption according to the count value CNTb. The current compensation circuit 340 of the third modified example is different from the first embodiment in that the current compensation circuit 340 corrects the current consumption according to the count value CNTb.

Figure 13:
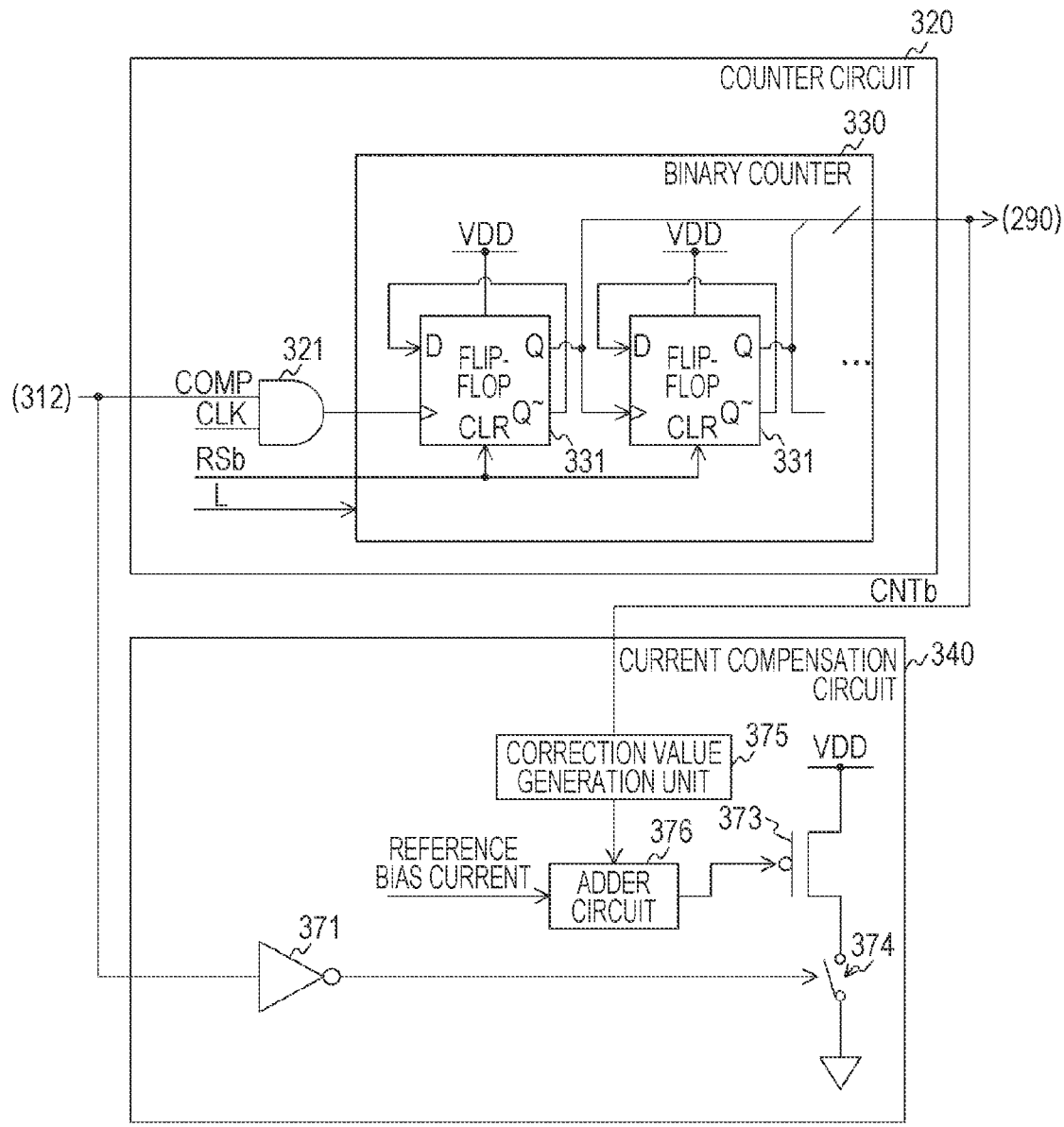
FIG. 13 is a circuit diagram showing a configuration example of a counter circuit and a current compensation circuit of a third modified example of the first embodiment.

FIG. 13 is a circuit diagram showing a configuration example of the counter circuit 320 and the current compensation circuit 340 of the third modified example of the first embodiment. The counter circuit 320 of the third modified example supplies the count value CNTb to the memory 290 and the current compensation circuit 340. The current compensation circuit 340 of the third modified example includes an inverter 371, a transistor 373, a switch 374, a correction value generation unit 375, and an adder circuit 376. The configuration of the inverter 371, the transistor 373, the switch 374 is the same as that of the second modified example.

The correction value generation unit 375 multiplies the count value CNTb by a predetermined coefficient and supplies the multiplied value to the adder circuit 376 as a correction value. Here, the coefficient multiplied to the count value CNTb is set based on a manufacturing process, temperature, voltage, current amount, and the like.

The adder circuit 376 supplies a current obtained by analogically adding a predetermined reference bias current to a current of the correction value to the gate terminal of the transistor 373.

As described above, according to the third modified example of the first embodiment, the current compensation circuit 340 corrects the bias current by a current of a value obtained by multiplying the count value CNTb by a predetermined coefficient, so that it is possible to consume a current of an appropriate value based on the count value CNTb.

2. Second Embodiment

Configuration Example of Digital Data Generation Unit

In the first embodiment, the digital data generation unit 240 generates digital data by using a shift register. In this configuration, a clock signal is directly inputted into the upper latch 243 and the lower latch 250, so that every time the clock signal changes, a through-current flows. To reduce the current consumption, it is desirable not to directly input the clock signal to these latches. The digital data generation unit 240 of the second embodiment is different from the first embodiment in that the digital data generation unit 240 generates digital data by not directly inputting the clock signal into the latches.

Figure 14A:
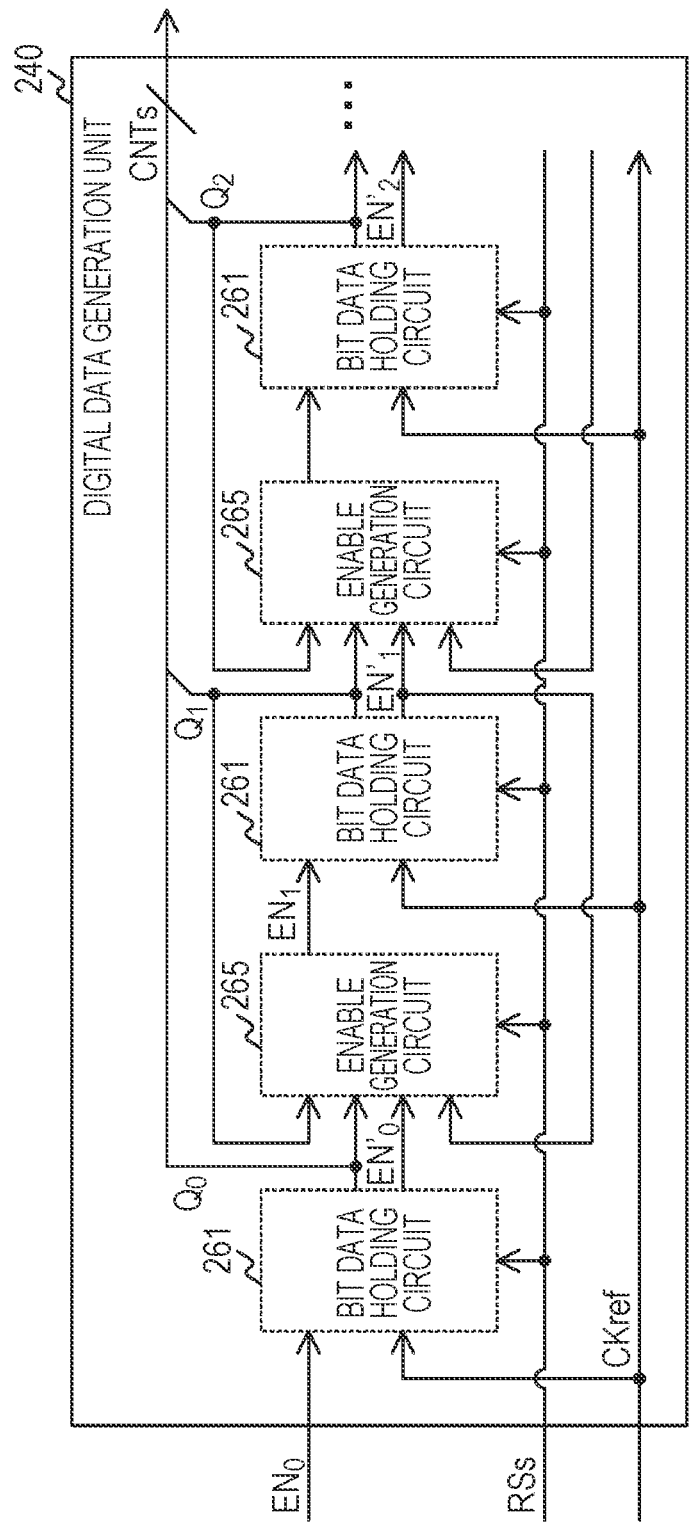
FIGS. 14A to 14C are circuit diagrams showing a configuration example of a digital data generation unit, a bit data holding circuit, and an enable generation circuit of a second embodiment.
Figure 14B:
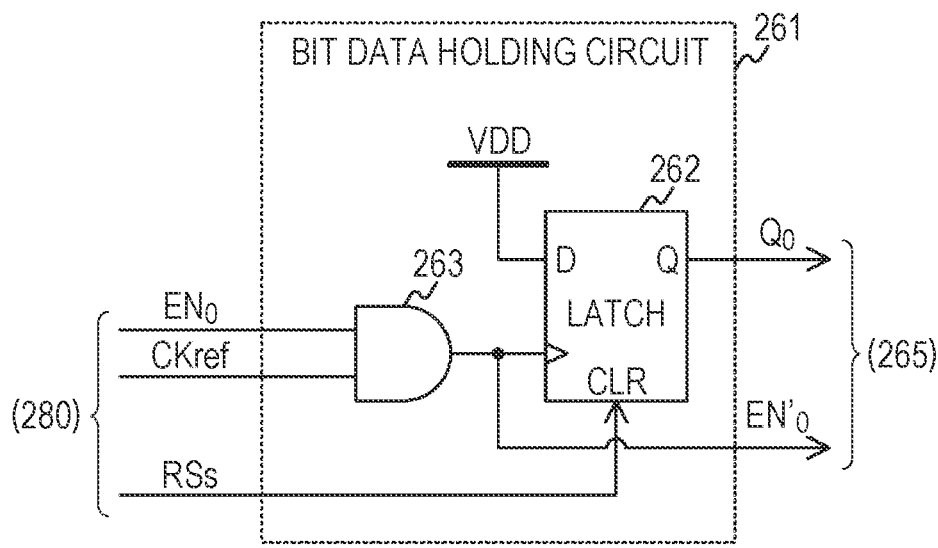
Figure 14C:
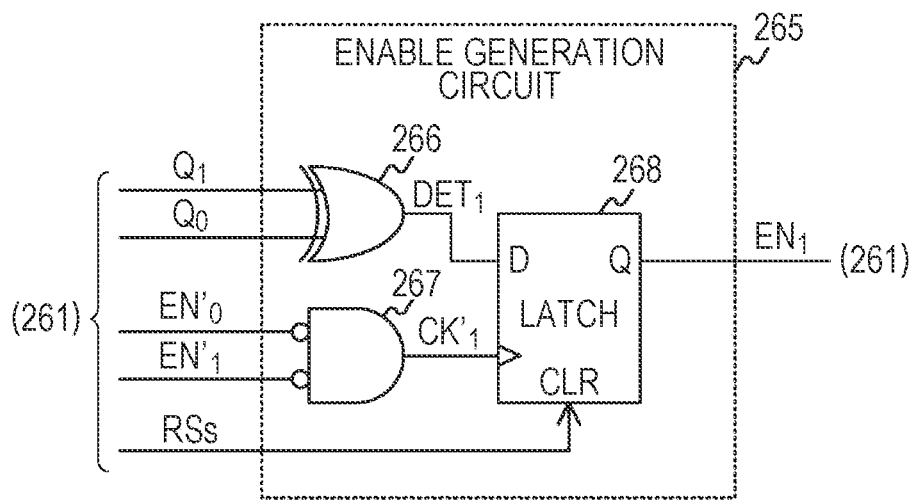

FIGS. 14A to 14C are circuit diagrams showing a configuration example of the digital data generation unit 240, a bit data holding circuit 261, and an enable generation circuit 265 of the second embodiment. FIG. 14A is a circuit diagram showing a configuration example of the digital data generation unit 240 of the second embodiment. The digital data generation unit 240 of the second embodiment includes multi-stage bit data holding circuits 261. The digital data generation unit 240 further includes the enable generation circuits 265, each of which is inserted in the previous stage of each of the second and the following stage bit data holding circuits 261. In other words, K bit data holding circuits 261 (K is an integer greater than or equal to 2) and (K−1) enable generation circuits 265 are provided. A circuit including (K−1) enable generation circuits 265 is an example of an enable generation unit described in claims. An enable signal $EN_0$ is inputted into the first stage bit data holding circuit 261 and an enable signal $EN_k$ (k is an integer from 0 to K−1) generated by the previous stage enable generation circuit 265 is inputted into the second and the following stage bit data holding circuits 261. The reset signal RSs and the reference clock signal CKref are inputted into each of the bit data holding circuits 261.

The first stage bit data holding circuit 261 outputs bit data $Q_0$ to the next stage enable generation circuit 265 and the DA conversion unit 255 and outputs an enable signal $EN'_0$ to the next stage enable generation circuit 265. The second and the following stage bit data holding circuits 261 output bit data $Q_k$ to the next stage enable generation circuit 265, the previous stage enable generation circuit 265, and the DA conversion unit 255. Further, the second and the following stage bit data holding circuits 261 output an enable signal $EN'_k$ to the next stage enable generation circuit 265 and the previous stage enable generation circuit 265. The last stage bit data holding circuit 261 outputs the bit data $Q_k$ to the DA conversion unit 255 and the previous stage enable generation circuit 265 and outputs an enable signal $EN'_k$ to the previous stage enable generation circuit 265.

An enable signal $EN'_{k-1}$ and bit data $Q_{k-1}$ from the previous stage bit data holding circuit 261, an enable signal $EN'_k$ and bit data $Q_k$ from the next stage bit data holding circuit 261, and the reset signal RSs are inputted into each of the enable generation circuits 265. The enable generation circuit 265 generates an enable signal $EN_k$ and supplies the enable signal $EN_k$ to the next stage bit data holding circuit 261.

FIG. 14B is a circuit diagram showing a configuration example of the bit data holding circuit 261 of the second embodiment. The bit data holding circuit 261 includes an AND gate 263 and a latch 262.

The AND gate 263 outputs a logical product of input values. The AND gate 263 supplies a signal of a logical product of the enable signal $EN_k$ and the reference clock signal CKref to the latch 262 as the enable signal $EN'_k$ and further supplies the signal to the next stage enable generation circuit 265 and the like.

The configuration of the latch 262 is the same as that of the upper latch 243 of the first embodiment. A high level signal is inputted into the data input terminal D of the latch 262 and the clock terminal CK of the latch 262 is connected to the AND gate 263. The bit data $Q_k$ is outputted from the data output terminal Q of the latch 262 and the reset signal RSs is inputted into the clear terminal CLR of the latch 262.

By this configuration, when a high level enable signal $EN'_k$ is inputted into the kth bit data holding circuit 261, the kth bit data holding circuit 261 changes the value of the bit data to a high level, and when the enable signal $EN'_k$ is not inputted, the kth bit data holding circuit 261 holds the bit data. When a high level reset signal RSs is inputted into the bit data holding circuit 261, the bit data holding circuit 261 changes the value of the bit data to low level.

FIG. 14C is a circuit diagram showing a configuration example of the enable generation circuit 265 of the second embodiment. The enable generation circuit 265 includes an XOR (exclusive OR) gate 266, an AND (logical product) gate 267, and a latch 268.

The XOR gate 266 outputs an exclusive OR of input values. The bit data $Q_k$ from the next stage bit data holding circuit 261 and the bit data $Q_{k-1}$ from the previous stage bit data holding circuit 261 are inputted into the XOR gate 266. The XOR gate 266 outputs an output signal $DET_k$ of an exclusive OR of these signals to the latch 268.

The XOR gate 266 is an example of a logical gate described in claims.

The AND gate 267 outputs a logical product of input values. A signal obtained by inverting the enable signal $EN'_k$ from the next stage enable generation circuit 265 and a signal obtained by inverting the enable signal $EN'_{k-1}$ from the previous stage enable generation circuit 265 are inputted into the AND gate 267. The AND gate 267 outputs a clock signal $CK'_k$ of a logical product of these signals to the latch 268. The AND gate 267 is an example of an output control unit described in claims.

The configuration of the latch 268 is the same as that of the upper latch 243 of the first embodiment. The data input terminal D of the latch 268 is connected to the XOR gate 266 and the clock terminal CK of the latch 268 is connected to the AND gate 267. The enable signal $EN_k$ is outputted from the data output terminal Q of the latch 262 and the reset signal RSs is inputted into the clear terminal CLR of the latch 262. The latch 268 is an example of an output unit described in claims.

By this configuration, the enable generation circuit 265 generates the enable signal $EN_k$ when the previous stage bit data holding circuit 261 is updated. When a high level enable signal $EN'_k$ is inputted into the enable generation circuit 265 from the next stage bit data holding circuit 261, the enable generation circuit 265 stops output of the enable signal $EN_k$. When a high level reset signal RSs is inputted into the enable generation circuit 265, the enable generation circuit 265 sets the enable signal $EN_k$ to low level.

Although the latch 262 holds the bit data, as described later, a flip-flop may be provided instead of the latch 262 and the flip-flop may hold the bit data. Although the latch 268 holds the enable signal, the enable signal may be held by a flip-flop instead of the latch 268. In this way, when the latches are replaced with flip-flops, a scan test can be easily carried out and a detection rate of circuit defects can be easily improved.

FIG. 15 is a diagram showing an example of an operation table of the bit data holding circuit 261 of the second embodiment. When the value of either of the enable signal $EN_k$ and the reference clock signal CKref is "0", the kth stage bit data holding circuit 261 holds data of the previous state and outputs the enable signal $EN'_k$ having a value of "0".

On the other hand, when the value of both the enable signal $EN_k$ and the reference clock signal CKref is "1", the kth stage bit data holding circuit 261 updates the bit data to "1" and outputs the enable signal $EN'_k$ having a value of "1". When the reset signal RSs is high level, the bit data holding circuit 261 updates the bit data to "0".

FIG. 16 is a diagram showing an example of an operation table of the enable generation circuit 265 of the second embodiment. When both the enable signals $EN'_{k-1}$ and $EN'_k$ are "1", the previous stage enable generation circuit 265 of the kth stage bit data holding circuit 261 holds the enable signal $EN_k$ of the previous state. On the other hand, when at least either one of the enable signals $EN'_{k-1}$ and $EN'_k$ is "0" and the values of the bit data $Q_{k-1}$ and $Q_k$ are the same, the enable generation circuit 265 outputs the enable signal $EN_k$ of "0". When at least either one of the enable signals $EN'_{k-1}$ and $EN'_k$ is "0" and the values of the bit data $Q_{k-1}$ and $Q_k$ are not the same, the enable generation circuit 265 outputs the enable signal $EN_k$ of "1".

Figure 17:
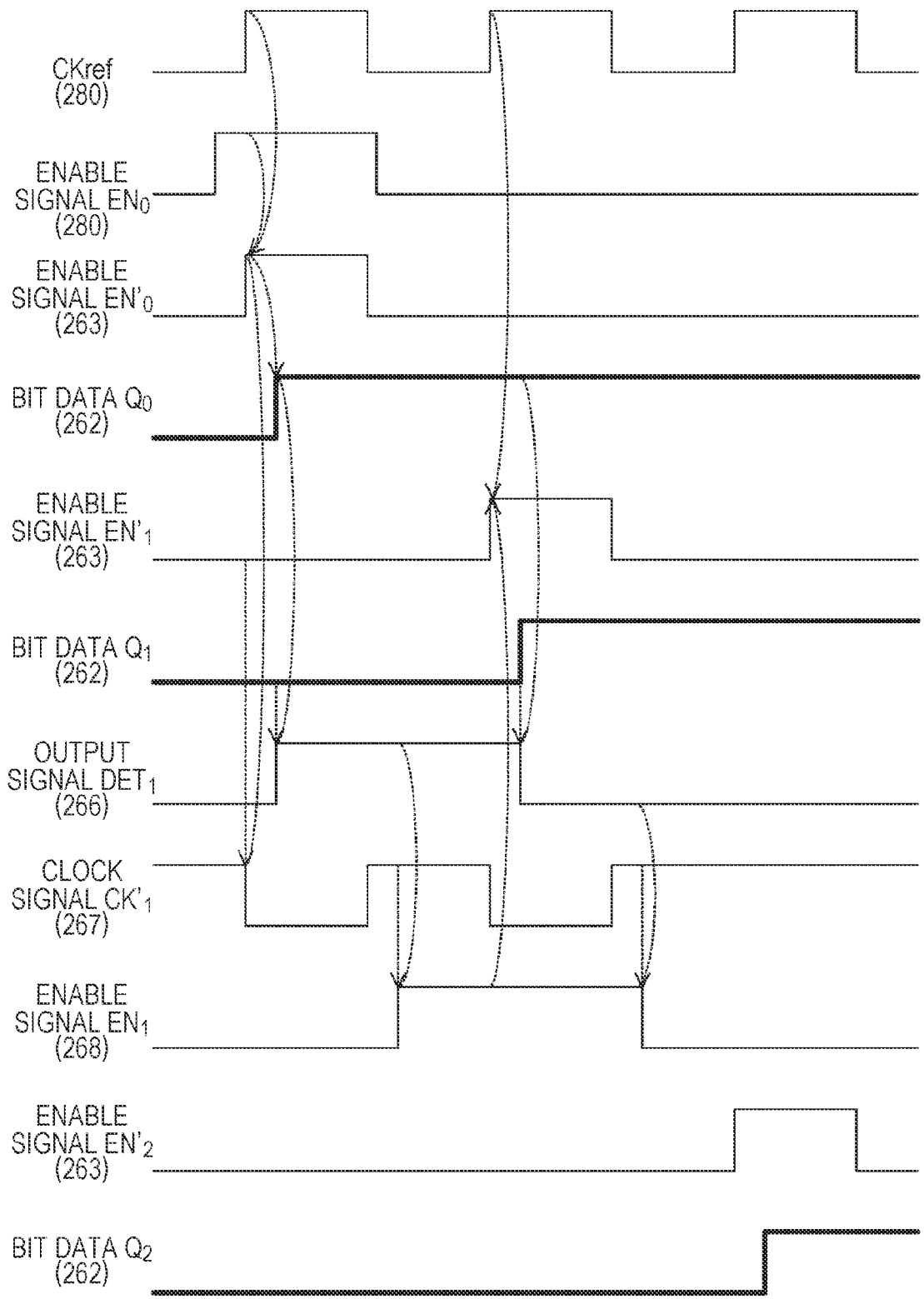
FIG. 17 is a timing chart showing an example of an operation of the digital data generation unit of the second embodiment.

FIG. 17 is a timing chart showing an example of an operation of the digital data generation unit 240 of the second embodiment. When the timing control unit 280 sets the enable signal $EN_0$ and the reference clock signal CKref to a high level, the first stage AND gate 263 generates a high level enable signal $EN'_0$. When the enable signal $EN'_0$ becomes high level, the first stage latch 262 updates the bit data $Q_0$ to a high level.

When the bit data $Q_0$ is updated to a high level and the bit data $Q_1$ is low level, the XOR gate 266 generates a high level output signal $DET_1$.

When both the enable signals $EN'_0$ and $EN'_1$ become low level, the AND gate 267 outputs a high level clock signal $CK'_0$. When the clock signal $CK'_0$ becomes high level, the latch 268 outputs a high level output signal $DET_1$ as the enable signal $EN_1$.

When the enable signal $EN_1$ and the reference clock signal CKref become high level, the second stage AND gate 263 generates a high level enable signal $EN'_1$. When the enable signal $EN'_1$ becomes high level, the second stage latch 262 updates the bit data $Q_1$ to a high level.

When both the bit data $Q_0$ and the bit data $Q_1$ are updated to a high level, the previous stage XOR gate 266 of the second stage bit data holding circuit 261 sets the output signal $DET_1$ to a low level. When the clock signal $CK'_0$ becomes high level, the previous stage latch 268 of the second stage bit data holding circuit 261 outputs a low level output signal $DET_1$ as the enable signal $EN_1$.

When the third stage AND gate 263 generates a high level enable signal $EN'_2$, the third stage latch 262 outputs high level bit data $Q_2$.

FIGS. 18A and 18B are diagrams for explaining the current consumption of the digital data generation unit 240 of the second embodiment. FIG. 18A is a diagram showing an example of an operation of the digital data generation unit 240 of the first embodiment. FIG. 18B is a diagram showing an example of an operation of the digital data generation unit 240 of the second embodiment. In FIGS. 18A and 18B, a shadowed status indicates that when transferring to the status, a through-current flows through a latch and the current consumption is larger than that in a holding state.

As shown in FIG. 18A, in the first embodiment, in the upper latches that hold bit data of each digit, every time the reference clock signal CKref changes from the high level to the low level, the current consumption larger than that in the holding state flows. In the lower latches that hold bit data of each digit, every time the reference clock signal CKref changes from the low level to the high level, a large current consumption flows.

On the other hand, as shown in FIG. 18B, in the second embodiment, only when the reference clock signal CKref first becomes high level in the first stage bit data holding circuit, the current consumption larger than that in the holding state flows. In kth stage bit data holding circuit, only when the reference clock signal CKref becomes high level for the kth time, a large current consumption flows. In the enable generation circuit, when the previous stage bit data holding circuit is updated or when the next stage bit data holding circuit is updated, a large current consumption flows.

As described above, in the second embodiment, the reference clock signal CKref is not directly inputted into the latch and the next stage latch is updated by the enable signal generated by the update of the previous stage latch. Therefore, as illustrated in FIGS. 18A and 18B, the frequency that a through-current flows in the digital data generation unit 240 of the second embodiment decreases and the current consumption is reduced as compared with the first embodiment. The current consumption is reduced, so that according to the second embodiment, it is possible to suppress IR drop and voltage variation (LdI/dt) due to the inductance component. Thereby, it is possible to increase the operating frequency of the digital data generation unit 240.

As described above, according to the second embodiment of the present technique, the next stage latch is updated by the enable signal generated by the update of the previous stage latch, so that it is possible to reduce the update frequency of the latch. Thereby, it is possible to reduce the current consumption of the digital data generation unit 240.

First Modified Example

In the second embodiment, the bit data holding circuit 261 includes the AND gate 263 and the enable generation circuit 265 includes the AND gate 267. However, it is not limited to this configuration as long as the same operation can be realized. For example, the AND gate 263 and the AND gate 267 can be replaced with NAND (negative AND) gates. Further, the digital data generation unit 240 can cause flip-flops to hold data instead of the latches 262 and 268. The digital data generation unit 240 of a first modified example of the second embodiment is different from the second embodiment in that the digital data generation unit 240 includes NAND gates instead of the AND gate 263 and the AND gate 267 and includes flip-flops instead of the latches 262 and 268.

Figure 19A:
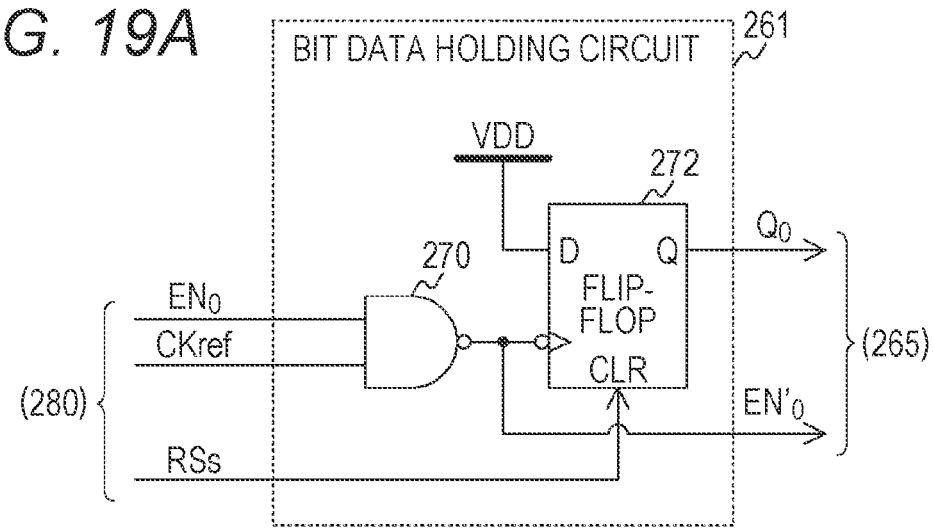
FIGS. 19A and 19B are circuit diagrams showing a configuration example of a bit data holding circuit and an enable generation circuit of a first modified example of the second embodiment.
Figure 19B:
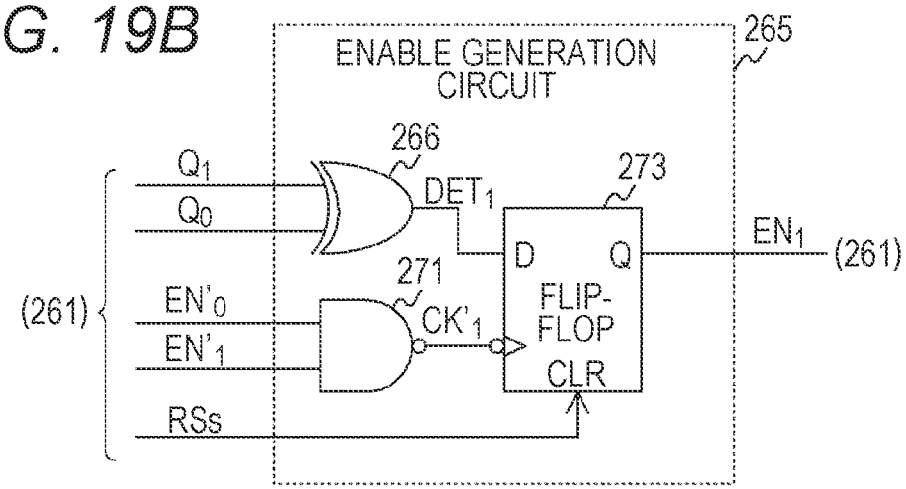

FIGS. 19A and 19B are circuit diagrams showing a configuration example of the bit data holding circuit 261 and the enable generation circuit 265 of the first modified example of the second embodiment. FIG. 19A is a circuit diagram showing a configuration example of the bit data holding circuit 261 of the first modified example. The bit data holding circuit 261 of the first modified example is different from the first embodiment in that the bit data holding circuit 261 includes a NAND gate 270 instead of the AND gate 263 and includes a flip-flop 272 instead of the latch 262.

The NAND gate 270 outputs a negative AND of input values. The enable signal $EN_{k-1}$ and the reference clock signal CKref are inputted into the NAND gate 270. The NAND gate 270 outputs a signal indicating a negative AND of these signals to the enable generation circuit 265 as the enable signal $EN'_k$. A signal obtained by inverting the enable signal $EN'_k$ is inputted into the clock terminal CK of the flip-flop 272.

The configuration of the flip-flop 272 is the same as that of the flip-flop 241 of the first embodiment.

FIG. 19B is a circuit diagram showing a configuration example of the enable generation circuit 265 of the first modified example. The enable generation circuit 265 of the first modified example is different from the second embodiment in that the enable generation circuit 265 includes a NAND gate 271 instead of the AND gate 267 and includes a flip-flop 273 instead of the latch 268.

The NAND gate 271 outputs a negative AND of input values. The enable signals $EN'_{k-1}$ and $EN'_k$ are inputted into the NAND gate 271. The NAND gate 271 outputs a signal indicating a negative AND of these signals as the clock signal $CK'_k$. A signal obtained by inverting the clock signal $CK'_k$ is inputted into the clock terminal CK of the flip-flop 273.

The configuration of the flip-flop 273 is the same as that of the flip-flop 241 of the first embodiment.

As described above, according to the first modified example of the second embodiment, the digital data generation unit 240 can generate the enable signal $EN'_k$ and the clock signal $CK'_k$ by using the NAND gates instead of the AND gate 263 and the AND gate 267. Further, according to the first modified example, data is held by the flip-flops instead of the latches, so that a scan test can be carried out.

Second Modified Example

In the second embodiment, the enable generation circuit 265 includes the XOR gate 266. However, it is not limited to this configuration as long as the same operation can be realized. For example, the XOR gate 266 can be replaced with an AND gate. The enable generation circuit 265 of a second modified example of the second embodiment is different from the second embodiment in that the enable generation circuit 265 includes an AND gate instead of the XOR gate 266.

Figure 20:
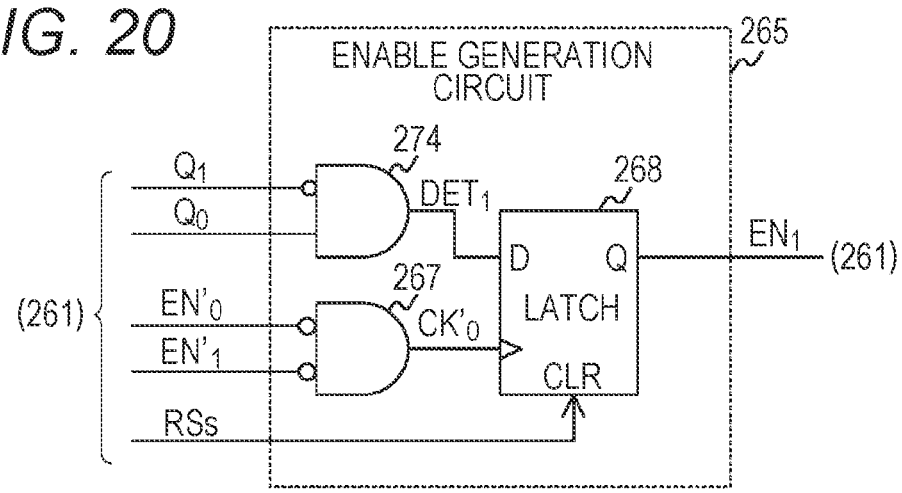
FIG. 20 is a circuit diagram showing a configuration example of an enable generation circuit of a second modified example of the second embodiment.

FIG. 20 is a circuit diagram showing a configuration example of the enable generation circuit 265 of the second modified example of the second embodiment. The enable generation circuit 265 of the second modified example is different from the second embodiment in that the enable generation circuit 265 includes an AND gate 272 instead of the XOR gate 266.

The AND gate 272 outputs a logical product of input values. A signal obtained by inverting the bit data $Q_{k-1}$ and the bit data $Q_k$ are inputted into the AND gate. The AND gate outputs a logical product of these signals as the output signal $DET_k$.

Due to the configurations of the latches 262 and 268, the bit data $Q_k$ of "1" may be outputted earlier than the bit data $Q_{k-1}$ of "1". In this case, the XOR gate 266 erroneously outputs the output signal $DET_k$ of "1". However, if the AND gate 272 is used instead of the XOR gate 266, even when the bit data $Q_k$ of "1" is outputted earlier than the bit data $Q_{k-1}$ of "1", the AND gate 272 outputs the output signal $DET_k$ of "0". Therefore, the digital data generation unit 240 can operate correctly. As described above, according to the second modified example of the second embodiment, the digital data generation unit 240 can generate the output signal $DET_k$ by using the AND gate instead of the XOR gate 266.

The embodiments described above represent an example for embodying the present technique, and the matters in the embodiments and the matters specifying the invention in the claims are in correspondence with each other. In the same manner, the matters specifying the invention in the claims and the matters in the embodiments given the same names as those of the matters specifying the invention are in correspondence with each other. However, the present technique is not limited by the embodiments, but can be embodied by variously modifying the embodiments without departing from the spirit and scope of the present technique.

The processing procedures described in the embodiments may be considered as a method including the series of procedures or may be considered as a program that causes a computer to execute the series of procedures or a recording medium that stores the program. As the recording medium, for example, a CD (Compact Disc), an MD (MiniDisc), a DVD (Digital Versatile Disc), a memory card, a Blu-ray (registered trademark) Disc can be used.

The effect described here is not necessarily limited, but the effect may be one of the effects described in the present disclosure.

The present technique may have the following configurations:

(1) An analog-to-digital conversion device including a plurality of counting period supply units that supply a period of length according to a voltage of an analog signal inputted into each counting period supply unit based on the voltage of the analog signal as a counting period, a plurality of counter circuits which are connected to a common power supply and which perform a counting operation that counts a count value in the counting period different from each other and generate a digital signal indicating the count value, and a plurality of compensation circuits which are connected to the power supply and which operate so that the greater the number of counter circuits that stop the counting operation among the plurality of counter circuits, the greater the number of the compensation circuits that operate.

(2) The analog-to-digital conversion device described in (1), in which each of the plurality of counter circuits includes multi-stage first flip-flops connected to the power supply and each of the multi-stage first flip-flops updates a holding value at an update cycle twice an update cycle of a previous stage first flip-flop, and each of the plurality of compensation circuits includes two second flip-flops connected to the power supply and each of the two second flip-flops updates a holding value at the same cycle as that of a first stage first flip-flop.

(3) The analog-to-digital conversion device described in (1), in which each of the plurality of compensation circuits includes a circuit that performs the same counting operation as that of the counter circuit as a dummy counter.

(4) The analog-to-digital conversion device described in any one of (1) to (3), in which each of the plurality of compensation circuits includes a constant current output unit that outputs a constant output current when the constant current output unit is instructed to output an output current, and an output control unit which is associated with one of the plurality of counter circuits and which instructs the constant current output unit to output the output current when the counter circuit with which the output control unit is associated stops the counting operation.

(5) The analog-to-digital conversion device described in (4), in which the constant current output unit includes a transistor where an input terminal is connected to the power supply, a predetermined bias current is inputted into a control terminal, and the output current is outputted from an output terminal, and a connection control unit that connects the output terminal of the transistor to a reference terminal of which potential is lower than that of the power supply when output of the output current is instructed.

(6) The analog-to-digital conversion device described in (5), in which the compensation circuit further includes a bias current input unit that inputs a current including a current of a value obtained by multiplying the count value of the associated counter circuit by a predetermined coefficient and a predetermined reference current into the transistor as the bias current.

(7) The analog-to-digital conversion device described in any one of (1) to (6), further including:

multi-stage holding circuits that change a value of bit data when an enable signal is inputted and hold the bit data when the enable signal is not inputted;

a timing control unit that inputs the enable signal into a first stage holding circuit among the multi-stage holding circuits at a predetermined timing;

an enable generation unit that generates the enable signal when the bit data is changed in one of the holding circuits and inputs the enable signal into a next stage holding circuit of the holding circuit in which the bit data is changed; and a digital-to-analog conversion unit that converts a digital data including the bit data held by the multi-stage holding circuits into an analog reference signal, in which each of the plurality of counting period supply units supplies a period, in which a voltage of one of the analog signal and the reference signal is higher than a voltage of the other signal, as the counting period.

(8) The analog-to-digital conversion device described in (7), in which the enable generation unit includes a plurality of enable generation circuits, each of which is associated with the holding circuit different from each other, and the enable generation circuit includes a logical gate that generates the enable signal when the bit data held by the previous stage holding circuit of the holding circuit with which the enable generation circuit is associated is updated to a predetermined value, an output unit that outputs the generated enable signal to the holding circuit with which the enable generation circuit is associated in a period from when a predetermined output control signal is inputted to when the output control signal is inputted next time, and an output control unit that generates the output control signal and inputs the output control signal into the output unit when the enable signal is inputted into the previous stage holding circuit of the holding circuit with which the enable generation circuit is associated or when the enable signal is inputted into the holding circuit with which the enable generation circuit is associated.

(9) An analog-to-digital conversion device including a plurality of column cells that are connected to a common power supply, wherein each of the plurality of column cells includes a comparator that compares voltages of an analog signal and a ramp signal and outputs a comparison result, a counter circuit which is connected to the comparator and which performs a counting operation based on the comparison result, and a compensation circuit which is connected to the comparator and which operates when the counter circuit stops the counting operation.

(10) An image pickup element including a plurality of pixels that output an analog signal, a plurality of counting period supply units that supply a period of length according to a voltage of the analog signal inputted into each counting period supply unit from the pixel based on the voltage of the analog signal as a counting period, a plurality of counter circuits which are connected to a common power supply and which perform a counting operation that counts a count value in the counting period different from each other and generate a digital signal indicating the count value, and a plurality of compensation circuits which are connected to the power supply and which operate so that the greater the number of counter circuits that stop the counting operation among the plurality of counter circuits, the greater the number of the compensation circuits that operate.

(11) An image pickup device including a plurality of pixels that output an analog signal, a plurality of counting period supply units that supply a period of length according to a voltage of the analog signal inputted into each counting period supply unit from the pixel based on the voltage of the analog signal as a counting period, a plurality of counter circuits which are connected to a common power supply and which perform a counting operation that counts a count value in the counting period different from each other and generate a digital signal indicating the count value, a plurality of compensation circuits which are connected to the power supply and which operate so that the greater the number of counter circuits that stop the counting operation among the plurality of counter circuits, the greater the number of the compensation circuits that operate, and an image processing unit that processes image data including the digital signal.

REFERENCE SIGNS LIST

100 Image pickup device
110 Power supply circuit
120 Image pickup lens
130 Image processing unit
140 Display processing unit
150 Display unit
160 Camera control unit
170 Image recording control unit
180 Image recording unit
200 Image pickup element
210 Row scanning circuit 220 Pixel array unit
221 Pixel
230 Ramp signal generation unit
240 Digital data generation unit
241, 272, 273, 331, 351 Flip-flop
242, 244, 245, 248, 249, 371 Inverter
243 Upper latch
246, 247, 373 Transistor
250 Lower latch
255 DA conversion unit
261 Bit data holding circuit
262, 268 Latch
263, 321, 341 AND gate
265 Enable generation circuit
266 XOR gate
267 AND gate
270, 271 NAND gate
280 Timing control unit
285 Column scanning circuit
290 Memory
300 Column AD converter
310 Column cell
311 Sample-hold circuit
312 Comparator
320 Counter circuit
330 Binary counter
340 Current compensation circuit
350 Dummy circuit
360 Dummy counter
372 Constant current source
374 Switch
375 Correction value generation unit
376 Adder circuit

The invention claimed is:

1. An analog-to-digital conversion device comprising:
a plurality of counting period supply units that supply a period of length according to a voltage of an analog signal inputted into each counting period supply unit based on the voltage of the analog signal as a counting period;
a plurality of counter circuits which are connected to a common power supply and which perform a counting operation that counts a count value in the counting period different from each other and generate a digital signal indicating the count value; and
a plurality of compensation circuits which are connected to the power supply and which operate so that the greater the number of counter circuits that stop the counting operation among the plurality of counter circuits, the greater the number of the compensation circuits that operate.

2. The analog-to-digital conversion device according to claim 1, wherein
each of the plurality of counter circuits includes multi-stage first flip-flops connected to the power supply and each of the multi-stage first flip-flops updates a holding value at an update cycle twice an update cycle of a previous stage first flip-flop, and
each of the plurality of compensation circuits includes two second flip-flops connected to the power supply and each of the two second flip-flops updates a holding value at the same cycle as that of a first stage first flip-flop.

3. The analog-to-digital conversion device according to claim 1, wherein
each of the plurality of compensation circuits includes a circuit that performs the same counting operation as that of the counter circuit as a dummy counter.

4. The analog-to-digital conversion device according to claim 1, wherein
each of the plurality of compensation circuits includes
a constant current output unit that outputs a constant output current when the constant current output unit is instructed to output an output current, and
an output control unit which is associated with one of the plurality of counter circuits and which instructs the constant current output unit to output the output current when the counter circuit with which the output control unit is associated stops the counting operation.

5. The analog-to-digital conversion device according to claim 4, wherein
the constant current output unit includes
a transistor where an input terminal is connected to the power supply, a predetermined bias current is inputted into a control terminal, and the output current is outputted from an output terminal, and
a connection control unit that connects the output terminal of the transistor to a reference terminal of which potential is lower than that of the power supply when output of the output current is instructed.

6. The analog-to-digital conversion device according to claim 5, wherein
the compensation circuit further includes
a bias current input unit that inputs a current including a current of a value obtained by multiplying the count value of the associated counter circuit by a predetermined coefficient and a predetermined reference current into the transistor as the bias current.

7. The analog-to-digital conversion device according to claim 1, further comprising:
multi-stage holding circuits that change a value of bit data when an enable signal is inputted and hold the bit data when the enable signal is not inputted;
a timing control unit that inputs the enable signal into a first stage holding circuit among the multi-stage holding circuits at a predetermined timing;
an enable generation unit that generates the enable signal when the bit data is changed in one of the holding circuits and inputs the enable signal into a next stage holding circuit of the holding circuit in which the bit data is changed; and
a digital-to-analog conversion unit that converts a digital data including the bit data held by the multi-stage holding circuits into an analog reference signal,
wherein each of the plurality of counting period supply units supplies a period, in which a voltage of one of the analog signal and the reference signal is higher than a voltage of the other signal, as the counting period.

8. The analog-to-digital conversion device according to claim 7, wherein
the enable generation unit includes a plurality of enable generation circuits, each of which is associated with the holding circuit different from each other, and
the enable generation circuit includes
a logical gate that generates the enable signal when the bit data held by the previous stage holding circuit of the holding circuit with which the enable generation circuit is associated is updated to a predetermined value,
an output unit that outputs the generated enable signal to the holding circuit with which the enable generation circuit is associated in a period from when a predetermined output control signal is inputted to when the output control signal is inputted next time, and
an output control unit that generates the output control signal and inputs the output control signal into the output unit when the enable signal is inputted into the previous stage holding circuit of the holding circuit with which the enable generation circuit is associated or when the enable signal is inputted into the holding circuit with which the enable generation circuit is associated.

9. An image pickup element comprising:
a plurality of pixels that output an analog signal;
a plurality of counting period supply units that supply a period of length according to a voltage of the analog signal inputted into each counting period supply unit from the pixel based on the voltage of the analog signal as a counting period;
a plurality of counter circuits which are connected to a common power supply and which perform a counting operation that counts a count value in the counting period different from each other and generate a digital signal indicating the count value; and
a plurality of compensation circuits which are connected to the power supply and which operate so that the greater the number of counter circuits that stop the counting operation among the plurality of counter circuits, the greater the number of the compensation circuits that operate.

10. An image pickup device comprising:
a plurality of pixels that output an analog signal;
a plurality of counting period supply units that supply a period of length according to a voltage of the analog signal inputted into each counting period supply unit from the pixel based on the voltage of the analog signal as a counting period;
a plurality of counter circuits which are connected to a common power supply and which perform a counting operation that counts a count value in the counting period different from each other and generate a digital signal indicating the count value;
a plurality of compensation circuits which are connected to the power supply and which operate so that the greater the number of counter circuits that stop the counting operation among the plurality of counter circuits, the greater the number of the compensation circuits that operate; and
an image processing unit that processes image data including the digital signal.

* * * * *